United States Patent
Meng et al.

(10) Patent No.: US 8,816,456 B2
(45) Date of Patent: Aug. 26, 2014

(54) MAGNETORESISTIVE DEVICE AND A METHOD OF FORMING THE SAME

(71) Applicants: Hao Meng, Singapore (SG); Rachid Sbiaa, Singapore (SG)

(72) Inventors: Hao Meng, Singapore (SG); Rachid Sbiaa, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/725,902

(22) Filed: Dec. 21, 2012

(65) Prior Publication Data

US 2013/0161770 A1 Jun. 27, 2013

Related U.S. Application Data

(60) Provisional application No. 61/578,260, filed on Dec. 21, 2011.

(51) Int. Cl.
*H01L 29/82* (2006.01)

(52) U.S. Cl.
USPC ......... 257/421; 257/E29.323; 438/3; 365/158

(58) Field of Classification Search
CPC .......... H01L 43/02; H01L 43/08; H01L 43/12
USPC ................ 257/421, E29.323; 438/3; 365/158
See application file for complete search history.

(56) References Cited

U.S. PATENT DOCUMENTS

| 2012/0292723 A1* | 11/2012 | Luo et al. | 257/421 |
| 2012/0306034 A1* | 12/2012 | Meng et al. | 257/421 |
| 2013/0148418 A1* | 6/2013 | Luo et al. | 365/158 |

* cited by examiner

*Primary Examiner* — Andy Huynh

(74) *Attorney, Agent, or Firm* — Blakely, Sokoloff, Taylor & Zafman LLP.

(57) ABSTRACT

According to embodiments of the present invention, a magnetoresistive device is provided. The magnetoresistive device includes a fixed magnetic layer structure having a fixed magnetization orientation along a first easy axis, a free magnetic layer structure having a variable magnetization orientation along a second easy axis, and an offsetting magnetic layer structure having a magnetization orientation along an axis at least substantially non-parallel to at least one of the first easy axis or the second easy axis, wherein the fixed magnetic layer structure, the free magnetic layer structure and the offsetting magnetic layer structure are arranged one over the other. According to further embodiments of the present invention, a method of forming a magnetoresistive device is also provided.

20 Claims, 7 Drawing Sheets

US 8,816,456 B2

MAGNETORESISTIVE DEVICE AND A METHOD OF FORMING THE SAME

CROSS-REFERENCE TO RELATED APPLICATION

This application claims the benefit of priority of U.S. provisional application No. 61/578,260, filed 21 Dec. 2011, the content of it being hereby incorporated by reference in its entirety for all purposes.

TECHNICAL FIELD

Various embodiments relate to a magnetoresistive device and a method of forming a magnetoresistive device.

BACKGROUND

In conventional spin transfer torque magnetic random access memory (STT-MRAM) design, magnetizations of the free layer (FL) and the reference layer (RL) are along a same easy axis. Due to the small angle between the magnetizations of the FL and the RL, the critical switching current density ($J_c$) is up to $1 \times 10^6$ A/cm$^2$ for in-plane MRAM and $3 \times 10^6$ A/cm$^2$ for perpendicular MRAM, which limits the STT-MRAM storage density. Moreover, such design results in large $J_c$ distribution, which is due to (1) the thermal fluctuation effect and (2) the initial angle $\theta$ difference between devices to devices, which is un-avoidable in the fabrication process.

SUMMARY

According to an embodiment, a magnetoresistive device is provided. The magnetoresistive device may include a fixed magnetic layer structure having a fixed magnetization orientation along a first easy axis, a free magnetic layer structure having a variable magnetization orientation along a second easy axis, and an offsetting magnetic layer structure having a magnetization orientation along an axis at least substantially non-parallel to at least one of the first easy axis or the second easy axis, wherein the fixed magnetic layer structure, the free magnetic layer structure and the offsetting magnetic layer structure are arranged one over the other.

According to an embodiment, a method of forming a magnetoresistive device is provided. The method may include forming a fixed magnetic layer structure having a fixed magnetization orientation along a first easy axis, forming a free magnetic layer structure having a variable magnetization orientation along a second easy axis, and forming an offsetting magnetic layer structure having a magnetization orientation along an axis at least substantially non-parallel to at least one of the first easy axis or the second easy axis, wherein the fixed magnetic layer structure, the free magnetic layer structure and the offsetting magnetic layer structure are arranged one over the other.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1A:
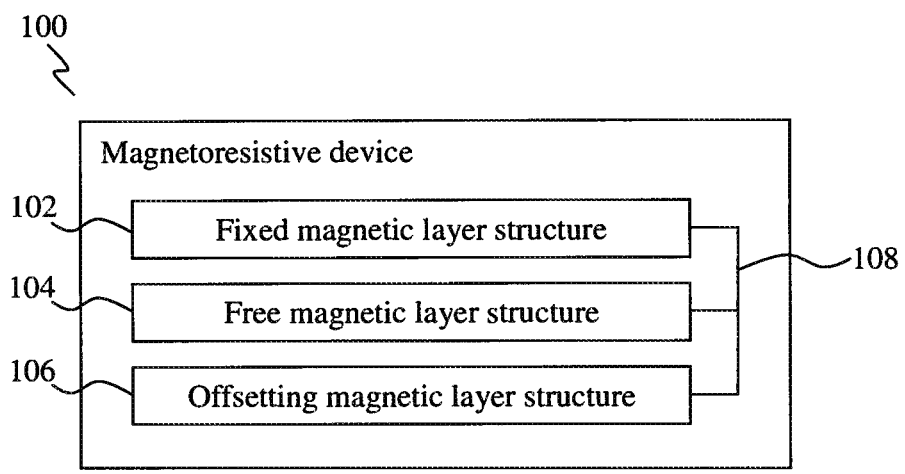
FIG. 1A shows a schematic block diagram of a magnetoresistive device, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Embodiments described in the context of one of the methods or devices are analogously valid for the other method or device. Similarly, embodiments described in the context of a method are analogously valid for a device, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element includes a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A or B" may include A or B or both A and B. Correspondingly, the phrase of the form of "at least one of A or B or C", or including further listed items, may include any and all combinations of one or more of the associated listed items.

Various embodiments relate to memory devices, for example related to magnetic tunnel junction (MTJ) stack structures. Various embodiments may relate to magnetoresistive random access memory (MRAM), e.g. spin torque transfer MRAM (STT-MRAM).

Various embodiments may provide magnetoresistive memory devices with off-aligned magnetization. Various embodiments may provide a one-bit per cell and multi-bit per cell magnetoresistive random access memory (MRAM). The magnetoresistive device of various embodiments may be a tunnel magnetoresistive (TMR) device or a giant magnetoresistive (GMR) device.

Various embodiments may provide magnetic junction or magnetic tunnel junction (MTJ) stack structures designed to reduce the critical switching current density, $J_c$, and improve its distribution or uniformity during the writing process for both in-plane STT-MRAM and perpendicular STT-MRAM. Various embodiments may provide magnetic junction or magnetic tunnel junction (MTJ) stack structures or arrangements that are designed to off align the magnetizations of a reference layer (RL) and a free layer (FL) in order to achieve the above-mentioned effects.

In various embodiments, the respective magnetizations of the free layer (FL) and the reference layer (RL) may be off aligned by including another magnetic layer (ML). The magnetic layer (ML) may be separated from FL or RL by a non magnetic separation layer (SL). In various embodiments, SL may be of a material with a short spin diffusion length so as to eliminate, or at least minimize, the polarization of spin current from ML and minimize the side spin torque transfer (SIT) effect from ML in order to achieve a better or improved uniformity and less noise. The magnetization of RL or FL may be offset by the stray field (or static field) from ML so that the respective magnetizations of RL and FL may be off aligned, resulting in an initial (pre-set) angle between the respective magnetizations of RL and FL. In various embodiments, $J_c$ and its distribution may be improved with such a pre-set angle. Such an arrangement or stack structure may be applied to STT-MRAM with perpendicular anisotropy or in-plane anisotropy. In addition, the magnetic tunnel junction (MTJ) stack structures of various embodiments may also be extended to multilevel STT-MRAM.

In order that the invention may be readily understood and put into practical effect, particular embodiments will now be described by way of examples and not limitations, and with reference to the figures.

Figure 1B:
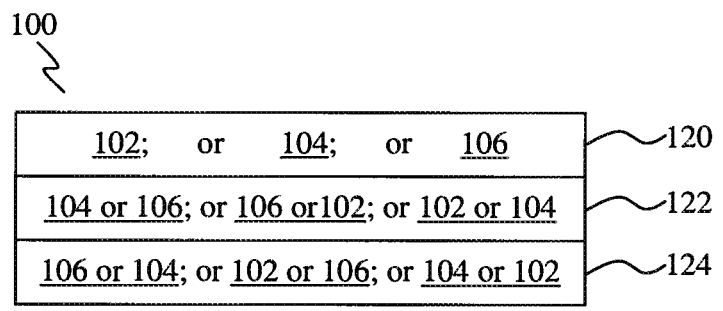
FIG. 1B shows a simplified cross-sectional representation of the magnetoresistive device of the embodiment of FIG. 1A, according to various embodiments.

FIG. 1A shows a schematic block diagram of a magnetoresistive device 100, while FIG. 1B shows a simplified cross-sectional representation of the magnetoresistive device 100 of the embodiment of FIG. 1A, according to various embodiments. The magnetoresistive device 100 includes a fixed magnetic layer structure (e.g. reference layer; RL) 102 having a fixed magnetization orientation along a first easy axis, a free magnetic layer structure (e.g. free layer; FL) 104 having a variable magnetization orientation along a second easy axis, and an offsetting magnetic layer structure (e.g. magnetic layer; ML) 106 having a magnetization orientation along an axis at least substantially non-parallel to at least one of the first easy axis or the second easy axis, wherein the fixed magnetic layer structure 102, the free magnetic layer structure 104 and the offsetting magnetic layer structure 106 are arranged one over the other. The offsetting magnetic layer structure 106 may have a fixed magnetization orientation. In FIG. 1A, the line represented as 108 is illustrated to show the relationship between the fixed magnetic layer structure 102, the free magnetic layer structure 104 and the offsetting magnetic layer structure 106, which may include electrical coupling and/or mechanical coupling.

In other words, the magnetoresistive device 100 may have a stack arrangement of the fixed magnetic layer structure 102, the free magnetic layer structure 104 and the offsetting magnetic layer structure 106. The fixed magnetic layer structure 102 may have its magnetization aligned along a first easy axis, which may be parallel to, perpendicular or at an angle relative to a thickness direction of the stack arrangement of the magnetoresistive device 100 or a thickness direction of any one of the fixed magnetic layer structure 102, the free magnetic layer structure 104 or the offsetting magnetic layer structure 106. The free magnetic layer structure 104 may have its magnetization aligned along a second easy axis, which may be parallel to, perpendicular or at an angle relative to a thickness direction of the stack arrangement of the magnetoresistive device 100 or a thickness direction of any one of the fixed magnetic layer structure 102, the free magnetic layer structure 104 or the offsetting magnetic layer structure 106. In the context of various embodiments, the magnetization orientation of the free magnetic layer structure 104 may be variable between two directions or orientations along the second easy axis.

The offsetting magnetic layer structure 106 may have its magnetization aligned along an axis, which may be aligned non-parallel to any one of or each of the first easy axis or the second easy axis. Such an arrangement may allow a static field generated by the offsetting magnetic layer structure 106 to act on the magnetization of any one of the fixed magnetic layer structure 102 or the free magnetic layer structure 104, which may offset or rotate the magnetization of the fixed magnetic layer structure 102 or the free magnetic layer structure 104 to an axis away from the first easy axis or the second easy axis respectively. It should be appreciated that the static field from the offsetting magnetic layer structure 106 may act on the respective magnetizations of each of the fixed magnetic layer structure 102 and the free magnetic layer structure 104. The static field from the offsetting magnetic layer structure 106 acting on the fixed magnetic layer structure 102 and the free magnetic layer structure 104 may differ in strength, for example, such that the respective magnetizations of each of the fixed magnetic layer structure 102 and the free magnetic layer structure 104 may be offset by different amounts or degrees.

In the context of various embodiments, the first easy axis and the second easy axis may be at least substantially parallel to each other.

In the context of various embodiments, the axis of the magnetization orientation of the offsetting magnetic layer structure 106 may be at least substantially orthogonal (perpendicular) to at least one of the first easy axis or the second easy axis.

In the context of various embodiments, the term "fixed magnetic layer structure" may mean a magnetic layer structure having a fixed magnetization orientation. The fixed magnetic layer structure may include a hard ferromagnetic material. The hard ferromagnetic material may be resistant to magnetization and demagnetization (i.e. not easily magnetized and demagnetized), and may have a high hysteresis loss and a high coercivity. In the context of various embodiments, a fixed magnetic layer structure may be referred to as a "hard layer", a "hard magnetic layer" or a "ferromagnetic hard layer". In the context of various embodiments, the fixed magnetic layer structure may act as a reference layer.

In the context of various embodiments, the term "free magnetic layer structure" may mean a magnetic layer structure having a variable or switchable magnetization orientation. In other words, the magnetization orientation may be varied or switched, for example by applying a current, such as a spin-polarized current. The magnetization orientation of the free magnetic layer structure may be varied, depending on the degree or amount of the magnetization reversal field (or current). The free magnetic layer structure may include a soft ferromagnetic material. The soft ferromagnetic material may be receptive to magnetization and demagnetization (i.e. easily magnetized and demagnetized), and may have a small hysteresis loss and a low coercivity, in comparison to the fixed magnetic layer structure. In the context of various embodiments, a free magnetic layer structure may be referred to as a "soft layer", a "soft magnetic layer" or a "ferromagnetic soft layer". In the context of various embodiments, the free magnetic layer structure may act as a storage layer.

In the context of various embodiments, the term "easy axis" as applied to magnetism may mean an energetically favorable direction of spontaneous magnetization as a result of magnetic anisotropy. The magnetization orientation of a ferromagnetic layer may be aligned along the easy axis.

In the context of various embodiments, a magnetization orientation aligned along an axis or an easy axis may be oriented in any one of two opposite directions along the axis or the easy axis, or switchable between the two opposite directions along the axis or the easy axis, where the two opposite directions are parallel to the axis or the easy axis.

As shown in FIG. 1B, the fixed magnetic layer structure 102, the free magnetic layer structure 104 and the offsetting magnetic layer structure 106 may be arranged one over the other. For example, the fixed magnetic layer structure 102 may be arranged as the top layer 120 of the magnetoresistive device 100, with the intermediate layer 122 being the free magnetic layer structure 104 and the bottom layer 124 being the offsetting magnetic layer structure 106, or the intermediate layer 122 being the offsetting magnetic layer structure 106 and the bottom layer 124 being the free magnetic layer structure 104.

In embodiments where the free magnetic layer structure 104 is arranged as the top layer 120 of the magnetoresistive device 100, the intermediate layer 122 may be the offsetting magnetic layer structure 106 with the bottom layer 124 being the fixed magnetic layer structure 102, or the intermediate layer 122 may be the fixed magnetic layer structure 102 with the bottom layer 124 being the offsetting magnetic layer structure 106.

In embodiments where the offsetting magnetic layer structure 106 is arranged as the top layer 120 of the magnetoresistive device 100, the intermediate layer 122 may be the fixed magnetic layer structure 102 with the bottom layer 124 being the free magnetic layer structure 104, or the intermediate layer 122 may be the free magnetic layer structure 104 with the bottom layer 124 being the fixed magnetic layer structure 102.

In the context of various embodiments, the magnetoresistive device 100 may further include a spacer layer between the fixed magnetic layer structure 102 and the free magnetic layer structure 104. The spacer layer may include a non-conductive and non-magnetic material or an insulator material, for example including but not limited to magnesium oxide (MgO), alumina ($AlO_x$), and titanium oxide ($TiO_x$). By arranging a non-conductive and non-magnetic material or insulator as the spacer layer between the fixed magnetic layer structure 102 and the free magnetic layer structure 104, the magnetoresistive device 100 may be configured as a tunnel magnetoresistive (TMR) device.

However, it should be appreciated that the spacer layer between the fixed magnetic layer structure 102 and the free magnetic layer structure 104 may include a conductive and non-magnetic material or a conductor material, for example including but not limited to any one of or any combination of copper (Cu), silver (Ag), gold (Au), tantalum (TO, chromium (Cr), palladium (Pd), platinum (Pt), iridium (Ir), rhodium (Rh) or ruthenium (Ru). By arranging a conductive and non-magnetic material as the spacer layer between the fixed magnetic layer structure 102 and the free magnetic layer structure 104, the magnetoresistive device 100 may be configured as a giant magnetoresistive (GMR) device.

In various embodiments, a static field or stray field of the offsetting magnetic layer structure 106 may offset the magnetization orientation of the fixed magnetic layer structure 102 such that between the first easy axis and an axis of the offset magnetization orientation of the fixed magnetic layer structure 102, an angle, $\theta_1$, (e.g. an acute angle; $0°<\theta_1<90°$) may be provided or defined. In various embodiments, the fixed magnetic layer structure 102 may be arranged between the offsetting magnetic layer structure 106 and the free magnetic layer structure 104. Therefore, the offsetting magnetic layer structure 106 may be arranged distal from the free magnetic layer structure 104. It should be appreciated that the static field may also offset the magnetization orientation of the free magnetic layer structure 104, for example by a less degree as compared to that for the fixed magnetic layer structure 102, due at least in part to its further distance from the offsetting magnetic layer structure 106.

In various embodiments, for a non-transitory state of the magnetization orientation of the free magnetic layer structure 104, a static field or stray field of the offsetting magnetic layer structure 106 may offset the non-transitory magnetization orientation of the free magnetic layer structure 104 such that between the second easy axis and an axis of the offset non-transitory magnetization orientation of the free magnetic layer structure 104, an angle, $\theta_2$, (e.g. an acute angle; $0°<\theta_2<90°$) may be provided or defined. In various embodiments, the free magnetic layer structure 104 may be arranged between the offsetting magnetic layer structure 106 and the fixed magnetic layer structure 102. Therefore, the offsetting magnetic layer structure 106 may be arranged distal from the fixed magnetic layer structure 102. It should be appreciated that the static field may also offset the magnetization orientation of the fixed magnetic layer structure 102, for example by a less degree as compared to that for the free magnetic layer structure 104, due at least in part to its further distance from the offsetting magnetic layer structure 106.

Therefore, a static field or stray field of the offsetting magnetic layer structure 106 may offset at least one of the magnetization orientation of the fixed magnetic layer structure 102 or the non-transitory magnetization orientation of the free magnetic layer structure 104.

In the context of various embodiments, the term "non-transitory state" may mean a non-temporary state, a non-transient state, or a long-lived state. Accordingly a non-transitory state of the magnetization orientation may mean that the magnetization orientation may remain in the non-transitory state for a period of time, as compared to for example, during the period when the magnetization orientation changes or switches, in a transitory state, in response to an electrical signal (e.g. during a writing process).

In various embodiments, at least one of the first easy axis is at least substantially parallel to a thickness direction of the fixed magnetic layer structure 102 (or the thickness direction of the stack arrangement of the magnetoresistive device 100) or the second easy axis is at least substantially parallel to a thickness direction of the free magnetic layer structure 104 (or the thickness direction of the stack arrangement of the magnetoresistive device 100). With such an arrangement, the magnetoresistive device 100 has perpendicular anisotropy.

In various embodiments, at least one of the first easy axis is at least substantially perpendicular to a thickness direction of the fixed magnetic layer structure 102 (or the thickness direction of the stack arrangement of the magnetoresistive device 100) or the second easy axis is at least substantially perpendicular to a thickness direction of the free magnetic layer structure 104 (or the thickness direction of the stack arrangement of the magnetoresistive device 100). With such an arrangement, the magnetoresistive device 100 has in-plane anisotropy.

In the context of various embodiments, the magnetoresistive device 100 may further include a spacer layer between the offsetting magnetic layer structure 106 and at least one of the fixed magnetic layer structure 102 or the free magnetic layer structure 104, the spacer layer having a spin diffusion length configured to reduce interaction of a spin current from the offsetting magnetic layer structure 106 on at least one of the fixed magnetic layer structure 102 or the free magnetic layer structure 104.

In the context of various embodiments, the term "spin diffusion length" may mean a length or distance scale over which electrons are de-polarized. In other words, the spin diffusion length may relate to the distance spins may travel or survive in a material. Spin diffusion length varies depending on the material. As non-limiting examples, the spin diffusion length for copper (Cu) may be more than 1 μm, while the spin diffusion length for tantalum (Ta) may be less than 5 nm.

In context of various embodiments, the spacer layer between the offsetting magnetic layer structure 106 and at least one of the fixed magnetic layer structure 102 or the free magnetic layer structure 104 may include or may be of a non-magnetic material, e.g. a conductive and non-magnetic material, for example including but not limited to tantalum (Ta), palladium (Pd), platinum (Pt), ruthenium (Ru), rhodium (Rh), hafnium (Hf), zirconium (Zr), iridium (Ir), osmium (Os), titanium (Ti), vanadium (V), chromium (Cr), or any combination thereof. These materials have a short spin diffusion length in order to minimise or eliminate the effect of the spin current from the offsetting magnetic layer structure 106 on any one of or each of the fixed magnetic layer structure 102 or the free magnetic layer structure 104.

In context of various embodiments, the spacer layer between the offsetting magnetic layer structure 106 and at least one of the fixed magnetic layer structure 102 or the free magnetic layer structure 104 may include copper (Cu) which may have a spin diffusion length in the micrometer scale.

In various embodiments, the spacer layer between the offsetting magnetic layer structure 106 and at least one of the fixed magnetic layer structure 102 or the free magnetic layer structure 104 may have a thickness greater than 1 nm, for example a thickness in a range of between about 1 nm and about 15 nm, e.g. between about 1 nm and about 8 nm, between about 1 nm and about 5 nm, between about 5 nm and about 15 nm, between about 10 nm and about 15 nm, or between about 3 nm and about 8 nm.

It should be appreciated the spacer layer between the offsetting magnetic layer structure 106 and at least one of the fixed magnetic layer structure 102 or the free magnetic layer structure 104 may include a non-conductive and non-magnetic material, although there are challenges where the non-conductive spacer layer may degrade the output signal.

In the context of various embodiments, the magnetoresistive device 100 may further include an anti-ferromagnetic (AFM) layer configured for exchange biasing with the offsetting magnetic layer structure 106. The AFM layer may be arranged adjacent to the offsetting magnetic layer structure 106. In the context of various embodiments, the terms "exchange biasing" and "exchange biased" may mean that the easy axis of a ferromagnetic layer may be set or oriented along a fixed direction by an anti-ferromagnetic (AFM) layer through AFM coupling at the interface between the ferromagnetic layer and the AFM layer. Exchange bias between an anti-ferromagnetic layer and a ferromagnetic layer is used in the reading sensor design in a hard disk drive. The effect of exchange bias, in the context of various embodiments, is to fix or orient the magnetization of a ferromagnetic layer along one direction, which may be more stable than by the ferromagnetic layer itself.

In the context of various embodiments, the magnetoresistive device 100 may further include a biasing magnetic layer configured to provide a bias field on the free magnetic layer structure 104 for compensating a bias field generated by the fixed magnetic layer structure 102 on the free magnetic layer structure 104. The bias field provided by the biasing magnetic layer may be larger than or at least substantially similar to the bias field generated by the fixed magnetic layer structure 102. Therefore, the bias field from the biasing magnetic layer on the free magnetic layer structure 104 may cancel the bias field generated by the fixed magnetic layer structure 102 on the free magnetic layer structure 104 or may exceed the bias field generated by the fixed magnetic layer structure 102 on the free magnetic layer structure 104. In the context of various embodiments, the term "bias field" generated by a magnetic layer structure may mean the sum of the static magnetic field and the exchange coupled field from the magnetic layer structure.

In various embodiments, the biasing magnetic layer may have a magnetization orientation at least substantially opposite to the magnetization orientation of the fixed magnetic layer structure 102. In various embodiments, the free magnetic layer structure 104 may be arranged between the biasing magnetic layer and the fixed magnetic layer structure 102.

In the context of various embodiments of a magnetoresistive device 100 with perpendicular anisotropy (e.g. a perpendicular STT-MRAM), the biasing magnetic layer may include a material including but not limited to cobalt-iron (CoFe) or cobalt-iron-boron (CoFeB).

In the context of various embodiments of a magnetoresistive device 100 with in-plane anisotropy (e.g. an in-plane STT-MRAM), the biasing magnetic layer may include a bilayer structure or a multilayer structure of (Co/Pd), (Co/Pt), (Col-Re/Pt), (CoFe/Pd) or (Ni/Co). As a non-limiting example, the biasing magnetic layer may include a (Co x/Pd y)$_n$ multilayer structure, where x is the thickness of the Co layer, for example between about 0.2 nm and about 0.5 nm (e.g. between about 0.2 nm and about 0.3 nm), y is the thickness of the Pd layer, for example between about 0.2 nm and about 0.9 nm (e.g. between about 0.2 nm and about 0.5 nm) and n is the number of repeats of the bilayer structure (Co/Pd), for example between 2 and 15. Such an arrangement and layer thicknesses may be employed for other multilayer structures.

In the context of various embodiments, the biasing magnetic layer may have a thickness of between about 2 nm and about 15 nm, e.g. between about 2 nm and about 10 nm, between about 2 nm and about 5 nm, between about 5 nm and about 15 nm, between about 10 nm and about 15 nm, or between about 4 nm and about 8 nm.

In the context of various embodiments, the magnetoresistive device 100 may further include a second spacer layer between the biasing magnetic layer and at least one of the fixed magnetic layer structure 102 or the free magnetic layer structure 104, the second spacer layer having a spin diffusion length configured to reduce interaction of a spin current from the biasing magnetic layer on at least one of the fixed magnetic layer structure 102 or the free magnetic layer structure 104.

In the context of various embodiments, the second spacer layer may include or may be of a non-magnetic material, e.g. a conductive and non-magnetic material, for example including but not limited to tantalum (Ta), palladium (Pd), platinum (Pt), ruthenium (Ru), rhodium (Rh), hafnium (HO, zirconium (Zr), iridium (Ir), osmium (Os), titanium (Ti), vanadium (V), chromium (Cr), or any combination thereof. In the context of various embodiments, the second spacer layer may include copper (Cu) which may have a spin diffusion length in the micrometer scale.

In various embodiments, the second spacer layer may have a thickness greater than 1 nm, for example a thickness in a range of between about 1 nm and about 15 nm, e.g. between about 1 nm and about 8 nm, between about 1 nm and about 5 nm, between about 5 nm and about 15 nm, between about 10 nm and about 15 nm, or between about 3 nm and about 8 nm.

In the context of various embodiments, the magnetoresistive device 100 may further include a second free magnetic layer structure having a variable magnetization orientation along a third easy axis, wherein the axis of the magnetization orientation of the offsetting magnetic layer structure 106 is at least substantially non-parallel to the third easy axis.

The second free magnetic layer structure may have its magnetization aligned along the third easy axis, which may be parallel to, perpendicular or at an angle relative to a thickness direction of the stack arrangement of the magnetoresistive device 100 or a thickness direction of any one of the fixed magnetic layer structure 102, the free magnetic layer structure 104, the offsetting magnetic layer structure 106 or the second free magnetic layer structure. In the context of various embodiments, the magnetization orientation of the second free magnetic layer structure may be variable between two directions or orientations along the third easy axis.

In the context of various embodiments, the second easy axis and the third easy axis may be at least substantially parallel to each other. In the context of various embodiments, the axis of the magnetization orientation of the offsetting magnetic layer structure 106 may be at least substantially orthogonal (perpendicular) to the third easy axis.

In various embodiments, the offsetting magnetic layer structure 106 may be arranged between the free magnetic layer structure 104 and the second free magnetic layer structure. Based on this arrangement, for a non-transitory state of the respective magnetization orientations of the free magnetic layer structure 104 and the second free magnetic layer structure, the static field of the offsetting magnetic layer structure 106 may offset the non-transitory magnetization orientation of the free magnetic layer structure 104 such that between the second easy axis and an axis of the offset non-transitory magnetization orientation of the free magnetic layer structure 104, an angle, $\eta_2$, (e.g. an acute angle; $0°<\theta_2<90°$) may be provided or defined, and/or may offset the non-transitory magnetization orientation of the second free magnetic layer structure such that between the third easy axis and an axis of the offset non-transitory magnetization orientation of the second free magnetic layer structure, an angle, $\theta_3$, (e.g. an acute angle; $0°<\theta_3<90°$) may be provided or defined. Therefore, in various embodiments, the static field of the offsetting magnetic layer structure 106 may offset or rotate the non-transitory magnetization orientations of the free magnetic layer structure 104 and the second free magnetic layer structure to a respective axis away from the second easy axis and the third easy axis. In various embodiments, the respective axes of the offset non-transitory magnetization orientation of the free magnetic layer structure 104 and the offset non-transitory magnetization orientation of the second free magnetic layer structure may be at least substantially parallel to each other. Nevertheless, it should be appreciated that the respective axes of the offset non-transitory magnetization orientation of the free magnetic layer structure 104 and the offset non-transitory magnetization orientation of the second free magnetic layer structure may be substantially non-parallel to each other.

In various embodiments, the fixed magnetic layer structure 102 may be arranged between the free magnetic layer structure 104 and the second free magnetic layer structure.

In the context of various embodiments, the magnetoresistive device 100 may further include a second offsetting magnetic layer structure having a magnetization orientation along an axis at least substantially non-parallel to the third easy axis. The axis of the magnetization orientation of the second offsetting magnetic layer structure may be at least substantially orthogonal (perpendicular) to the third easy axis. The second offsetting magnetic layer structure may have a fixed magnetization orientation. The second offsetting magnetic layer structure may be arranged adjacent to the second free magnetic layer structure. The offsetting magnetic layer structure 106 and the second offsetting magnetic layer structure may have respective magnetization orientations in the same direction. The offsetting magnetic layer structure 106 and the second offsetting magnetic layer structure may have respective magnetization orientations along respective axes parallel to each other.

In various embodiments, for a non-transitory state of the magnetization orientation of the second free magnetic layer structure, a static field or stray field of the second offsetting magnetic layer structure may offset the non-transitory magnetization orientation of the second free magnetic layer structure such that between the third easy axis and an axis of the offset non-transitory magnetization orientation of the second free magnetic layer structure, an angle, $\theta_3$, (e.g. an acute angle; $0°<\theta_3<90°$) may be provided or defined.

In the context of various embodiments, the magnetoresistive device 100 may further include a second fixed magnetic layer structure having a fixed magnetization orientation along a fourth easy axis, wherein the axis of the magnetization orientation of the second offsetting magnetic layer structure is at least substantially non-parallel to the fourth easy axis.

In the context of various embodiments, the magnetoresistance device 100 may further include a seed layer structure, wherein the fixed magnetic layer structure 102, the free magnetic layer structure 104 and the offsetting magnetic layer structure 106 may be disposed over the seed layer structure. The seed layer structure may facilitate the formation or growth of the fixed magnetic layer structure 102 and/or the free magnetic layer structure 104 and/or the offsetting magnetic layer structure 106, for example so as to achieve suitable crystallographic and magnetic properties for the fixed magnetic layer structure 102 and/or the free magnetic layer structure 104 and/or the offsetting magnetic layer structure 106. The seed layer structure may include one or more layers including a material including but not limited to any one of or a combination of tantalum (Ta), palladium (Pd), platinum (Pt), ruthenium (Ru), chromium (Cr), nickel (Ni), tungsten (W), aluminum (Al), molybdenum (Mo), iron (Fe), titanium (Ti), silver (Ag), or gold (Au).

In the context of various embodiments, the magnetoresistance device 100 may further include a cap layer structure disposed over the fixed magnetic layer structure 102, the free magnetic layer structure 104 and the offsetting magnetic layer structure 106. The cap layer structure may include one or more layers including a material including but not limited to any one of or a combination of tantalum (Ta), palladium (Pd), platinum (Pt), ruthenium (Ru), chromium (Cr), nickel (Ni), tungsten (W), aluminum (Al), molybdenum (Mo), titanium (Ti), silver (Ag), gold (Au), carbon (C), nitrogen (N) or hydrogen (H).

In the context of various embodiments, the cap layer structure and the seed layer structure may be configured or used as electrodes (e.g. top and bottom electrodes respectively) or separate metal electrodes may be formed or provided on the cap layer structure and the seed layer structure.

In the context of various embodiments, it should be appreciated that any one of or each of the fixed magnetic layer structure 102, the second fixed magnetic layer structure, the free magnetic layer structure 104 and the second free magnetic layer structure may be a single layer or may have composite structure, e.g. a bilayer structure or a multilayer structure of a plurality of the bilayer structures (e.g. a number of repeating bilayer structures). The single layer may mean a layer which, by itself, has the desired properties, while the composite structure may mean a structure which, as a combination, has the desired properties.

In the context of various embodiments, any one of or each of the fixed magnetic layer structure 102 or the second fixed magnetic layer structure may include a material including but not limited to cobalt (Co), iron (Fe), nickel (Ni), boron (B), nitrogen (N), or an alloy including at least one of cobalt (Co), iron (Fe), boron (B), or nickel (Ni).

In the context of various embodiments, any one of or each of the fixed magnetic layer structure 102 or the second fixed magnetic layer structure may include cobalt-iron-boron (CoFeB), a (Co/Ni) bilayer structure, or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt), iron-platinum (FePt) alloy, cobalt-platinum (CoPt) alloy, cobalt-iron (CoFe) and any combination thereof. For example, a fixed magnetic layer structure may include a bilayer or a multilayer of (Co/X), (CoFe/X) or (CoFeB/X) where X is palladium (Pd), platinum (Pt), FePt alloy, CoPt alloy, CoFe or any combination of these materials. Any combination of cobalt-iron-boron (CoFeB), (Co/Ni) multilayer, (Co/X) multilayer, (CoFe/X) multilayer and (CoFeB/X) multilayer may also be provided. As a non-limiting example, a fixed magnetic layer structure may include $(CoFe/Pd)_5$, of 5 layers of CoFe arranged alternately with 5 layers of Pd, i.e. (CoFe/Pd/CoFe/Pd/CoFe/Pd/CoFe/Pd/CoFe/Pd). In embodiments with a multilayer structure, the number of repeats of bilayer structures may be more than or equal to 2, e.g. 2, 3, 4, 5 or any higher number.

In the context of various embodiments, any one of or each of the fixed magnetic layer structure 102 or the second fixed magnetic layer structure may have a thickness between about 3 nm and about 50 nm, e.g. between about 3 nm and about 20 nm, between about 3 nm and about 10 nm, between about 10 nm and about 50 nm, between about 30 nm and about 50 nm or between about 5 nm and about 20 nm.

In the context of various embodiments, any one of or each of the fixed magnetic layer structure 102 or the second fixed magnetic layer structure may include a synthetic anti-ferromagnetic (SAF) structure. In embodiments where each of the fixed magnetic layer structure 102 and the second fixed magnetic layer structure include a synthetic anti-ferromagnetic (SAF) structure, the magnetoresistive device 100 may further include an anti-ferromagnetic (AFM) layer in between the fixed magnetic layer structure and the second fixed magnetic layer structure, where the fixed magnetic layer structure 102, the second fixed magnetic layer structure and the second ARvi layer may be arranged adjacent to each other.

In the context of various embodiments, any one of or each of the free magnetic layer structure 104 or the second free magnetic layer structure may include a material including but not limited to cobalt (Co), iron (Fe), nickel (Ni), boron (B), nitrogen (N), or an alloy including at least one of cobalt (Co), iron (Fe), boron (B), or nickel (Ni).

In the context of various embodiments, any one of or each of the free magnetic layer structure 104 or the second free magnetic layer structure may include cobalt-iron-boron (CoFeB), a (Co/Ni) bilayer structure, or a bilayer structure including a first layer of material selected from the group consisting of cobalt (Co), cobalt-iron (CoFe) and cobalt-iron-boron (CoFeB), and a second layer of material selected from the group consisting of palladium (Pd), platinum (Pt), iron-platinum (FePt) alloy, cobalt-platinum (CoPt) alloy, cobalt-iron (CoFe) and any combination thereof. For example, a free magnetic layer structure may include a bilayer or a multilayer of (Co/X), (CoFe/X) or (CoFeB/X) where X is palladium (Pd), platinum (Pt), FePt alloy, CoPt alloy, CoFe or any combination of these materials. Any combination of cobalt-iron-boron (CoFeB), (Co/Ni) multilayer, (Co/X) multilayer, (CoFe/X) multilayer and (CoFeB/X) multilayer may also be provided. As a non-limiting example, a free magnetic layer structure may include (CoFe/Pd), of 5 layers of CoFe arranged alternately with 5 layers of Pd, i.e. (CoFe/Pd/CoFe/Pd/CoFe/Pd/CoFe/Pd/CoFe/Pd). In embodiments with a multilayer structure, the number of repeats of bilayer structures may be more than or equal to 2, e.g. 2, 3, 4, 5 or any higher number.

In the context of various embodiments, any one of or each of the free magnetic layer structure 104 or the second free magnetic layer structure may have a thickness of between about 1 nm and about 3 nm, for example between about 1 nm and about 2 nm, between about 1 nm and about 1.5 nm, between about 1.5 nm and about 3 nm or between about 2 nm and about 3 nm.

In the context of various embodiments, any one of or each of the offsetting magnetic layer structure 106 or the second offsetting magnetic layer structure may include a single magnetic layer, a bilayer structure, a multilayer structure of a plurality of the bilayer structures, or a synthetic anti-ferromagnetic (SAF) structure.

In the context of various embodiments of a magnetoresistive device 100 with perpendicular anisotropy (e.g. a perpendicular STT-MRAM), any one of or each of the offsetting magnetic layer structure 106 or the second offsetting magnetic layer structure may include a material including but not limited to cobalt-iron (CoFe) or cobalt-iron-boron (CoFeB), for example in the form of a single magnetic layer.

In the context of various embodiments of a magnetoresistive device 100 with in-plane anisotropy (e.g. an in-plane STT-MRAM), any one of or each of the offsetting magnetic layer structure 106 or the second offsetting magnetic layer structure may include a bilayer structure or a multilayer structure of (Co/Pd), (Co/Pt), (CoFe/Pt), (CoFe/Pd) or (Ni/Co). Accordingly, any one of or each of the offsetting magnetic layer structure 106 or the second offsetting magnetic layer structure may include a bilayer structure including a first layer of material selected from the group consisting of cobalt (Co) and cobalt-iron (CoFe), and a second layer of material selected from the group consisting of palladium (Pd), platinum (Pt) and nickel (Ni).

As a non-limiting example, the biasing magnetic layer may include a $(Co\ x/Pd\ y)_n$ multilayer structure, where x is the thickness of the Co layer, for example between about 0.2 nm and about 0.5 nm (e.g. between about 0.2 nm and about 0.3 nm), y is the thickness of the Pd layer, for example between about 0.2 nm and about 0.9 nm (e.g. between about 0.2 nm and about 0.5 nm) and n is the number of repeats of the bilayer structure (Co/Pd), for example between 2 and 15. Such an arrangement and layer thicknesses may be employed for other multilayer structures.

In the context of various embodiments, any one of or each of the offsetting magnetic layer structure 106 or the second offsetting magnetic layer structure may have a thickness of between about 1 nm and about 20 nm, for example between about 1 nm and about 15 nm, between about 1 nm and about 10 nm, between about 1 nm and about 5 nm, between about 5 nm and about 20 nm, between about 10 nm and about 20 nm, or between about 5 nm and about 10 nm.

In the context of various embodiments, an anti-ferromagnetic (AFM) layer may include a material including but not limited to X-manganese or X-Y-manganese, wherein each of X and Y includes but not limited to platinum (Pt), palladium (Pd), iridium (Ir), rhodium (Rh), ruthenium (Ru) or iron (Fe). In the context of various embodiments, an AFM layer may have a thickness of between about 4 nm and about 30 nm, for example between about 4 nm and about 20 nm, between about 4 nm and about 10 nm, between about 10 nm and about 30 nm, between about 10 nm and about 20 nm or between about 8 nm and about 15 nm.

In the context of various embodiments, a synthetic anti-ferromagnetic (SAF) structure may include two antiferromagnetically coupled ferromagnetic layers, which may be pinned by an antiferromagnetic layer. A metal spacer layer, for example a conductive and non-magnetic spacer layer (e.g. ruthenium (Ru)) may be sandwiched in between the two antiferromagnetically coupled ferromagnetic layers. As a non-limiting example, the synthetic anti-ferromagnetic structure may have a structure or arrangement having two ferromagnetic layers, with a metal spacer layer having Ruderman-Kittel-Kasuya-Yosida (RKKY) coupling, such as but not limited to ruthenium (Ru), sandwiched in between the two ferromagnetic layers. One of the ferromagnetic layers may be a reference layer while the other ferromagnetic layer is a pinned layer, and in contact with an antiferromagnetic layer. By employing the metal spacer layer with an appropriate thickness, for example 5 nm or less, for example between about 1 nm and about 5 nm, between about 1 nm and about 3 nm or between about 3 nm and about 5 nm, the magnetization orientations of the two ferromagnetic layers may be anti-aligned (i.e. the layers are antiferromagnetically coupled). It should be appreciated that the appropriate thickness may be different for different metals. The type of coupling (e.g. anti-aligned or aligned) between the magnetization orientations of the two ferromagnetic layers may oscillate as a function of the metal spacer layer thickness. In various embodiments, the SAF may pin a reference layer and may reduce stray magnetic field that may act on a free layer.

In the context of various embodiments, where a spacer layer includes a conductive and non-magnetic material (e.g. an electrical conductor), the conductive and non-magnetic material may include but not limited to any one of or any combination of copper (Cu), silver (Ag), gold (Au), tantalum (Ta), chromium (Cr), palladium (Pd), platinum (Pt), iridium (Ir), rhodium (Rh) or ruthenium (Ru).

In the context of various embodiments, where a spacer layer is of a conductive and non-magnetic material, the spacer layer may have a thickness of between about 1 nm and about 20 nm, e.g. between about 1 nm and about 10 nm, between about 1 nm and about 5 nm, between about 5 nm and about 20 nm, between about 5 nm and about 10 nm, or between about 1.5 nm and about 5 nm.

In the context of various embodiments, where a spacer layer includes a non-conductive and non-magnetic material (e.g. an insulator), the non-conductive and non-magnetic material may include but not limited to any one of or any combination of magnesium oxide (MgO), alumina (AlO$_x$) or titanium oxide (TiO$_x$).

In the context of various embodiments, where a spacer layer is of a non-conductive and non-magnetic material, the spacer layer may have a thickness ranging from about 0.3 nm to about 2.0 nm, e.g. about 0.3 nm to about 1.5 nm, about 0.3 nm to about 0.8 nm, about 0.8 nm to about 2.0 nm, about 0.8 nm to about 1.5 nm or about 0.6 nm to about 1.2 nm.

In the context of various embodiments, the term "spacer layer" may be interchangeably used with the term "separation layer".

In the context of various embodiments, the resistance state of the magnetoresistive device 100 may change as a result of a change in its resistivity.

The fixed magnetic layer structure 102, the free magnetic layer structure 104 and the offsetting magnetic layer structure 106 may be part of or form part of a magnetic junction of the magnetoresistive device 100. Other layers as described herein may also be part of or form part of the magnetic junction. The magnetic junction may be a magnetic tunnel junction (MTJ), for example for a tunnel magnetoresistive (TMR) device.

In the context of various embodiments, the magnetization orientation of the free magnetic layer structure 104 and/or the second free magnetic layer structure may be in several possible directions, in order to represent various states such as "1" and "0" or multilevel states such as "00" "01" "10" and "11".

In the context of various embodiments, the magnetoresistive device 100 may be or may form part of a memory device, e.g. a magnetoresistive random access memory (MRAM), for example an MRAM with perpendicular anisotropy or in-plane anisotropy. In the context of various embodiments, the magnetoresistive device 100 may be or may form part of a spin transfer torque magnetoresistive random access memory (STT-MRAM), for example a STT-MRAM with perpendicular anisotropy (p-STT-MRAM) or in-plane anisotropy.

In the context of various embodiments, the magnetoresistive device 100 may be or may form part of a 1-bit per cell spin transfer torque magnetoresistive random access memory (STT-MRAM).

In the context of various embodiments, the magnetoresistive device 100 may be or may form part of a 2-bit per cell spin transfer torque magnetoresistive random access memory (STT-MRAM). In other words, the magnetoresistive device 100 may provide four resistance states, which may enable data storage of up to two bits of information, thereby providing a multi-bit per cell device allowing multi-state or multi-bit storage.

In the context of various embodiments, it should be appreciated that any n-bit (n 2) per cell spin transfer torque magnetoresistive random access memory (STT-MRAM) may be provided. In one non-limiting example, more than two free magnetic layer structures may be provided in the magnetoresistive device 100, for example three (3 bits), four (4 bits), five (5 bits) or any higher number of free magnetic layer structure. In a further non-limiting example, a combination of any number of the magnetoresistive device 100 (e.g. providing 1-bit per cell, 2-bit per cell or more) may be arranged or stacked one over the other, for example two, three, four or any higher number of the magnetoresistive device 100. In the context of various embodiments, a conductive and non-magnetic separating layer may be disposed between any two magnetoresistive devices 100 arranged or stacked one over the other.

In the context of various embodiments, the magnetoresistive device 100 may be configured to have in-plane anisotropy or perpendicular anisotropy.

In the context of various embodiments, the terms "first" and "second" with to respect to a feature (e.g. free magnetic layer structure) refer to separate but similar features. The terms may be interchangeable, for example depending on the arrangement of the magnetoresistive device. For example, where two free magnetic layer structures are arranged one above the other, the bottom free magnetic layer structure may be termed as "first free magnetic layer structure" while the top free magnetic layer structure may be termed as "second free magnetic layer structure", or vice versa.

In the context of various embodiments, the term "arranged" may be interchangeably used with the terms "disposed" and/or "formed".

In the context of various embodiments, the term "adjacent" as applied to two layers may include an arrangement where the two layers are in contact with each other or an arrangement where the two layers are separated by an intermediate layer, e.g. a spacer layer.

Figure 1C:
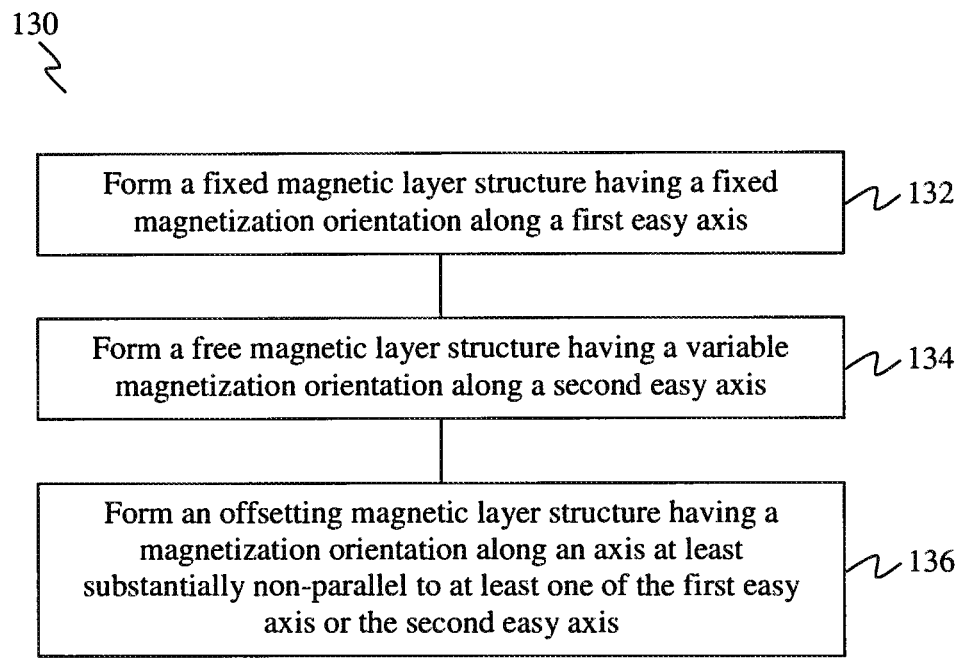
FIG. 1C shows a flow chart illustrating a method of forming a magnetoresistive device, according to various embodiments.

FIG. 1C shows a flow chart 130 illustrating a method of forming a magnetoresistive device, according to various embodiments.

At 132, a fixed magnetic layer structure having a fixed magnetization orientation along a first easy axis is formed.

At 134, a free magnetic layer structure having a variable magnetization orientation along a second easy axis is formed.

At 136, an offsetting magnetic layer structure having a magnetization orientation along an axis at least substantially non-parallel to at least one of the first easy axis or the second easy axis is formed.

In various embodiments of the method, the fixed magnetic layer structure, the free magnetic layer structure and the offsetting magnetic layer structure are arranged or formed one over the other.

Figure 2:
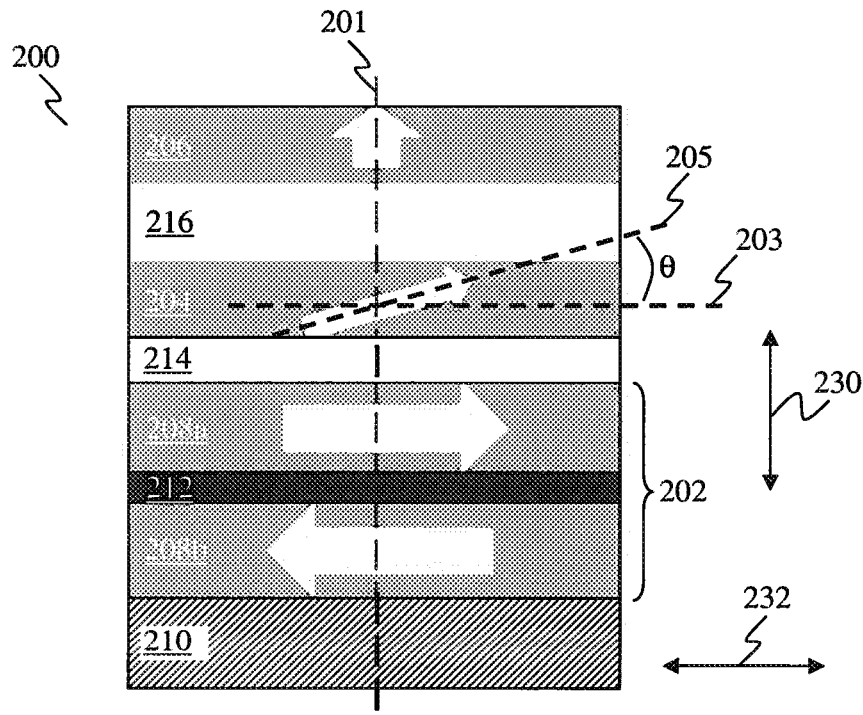
FIG. 2 shows a schematic cross-sectional view of a magnetoresistive device with in-plane anisotropy, according to various embodiments.

FIG. 2 shows a schematic cross-sectional view of a magnetoresistive device 200 with in-plane anisotropy, according to various embodiments. The magnetoresistive device 200 may be a 1-bit per cell magnetic random access memory (MRAM). The magnetoresistive device 200 may be a tunneling magnetoresistive (TMR) device, e.g. a spin transfer torque magnetic random access memory (STT-MRAM) with in-plane anisotropy. The magnetoresistive device 200 has a stack arrangement, having for example a plurality of magnetic or ferromagnetic layers.

The magnetoresistive device 200 includes a fixed magnetic layer structure 202, in the form of a synthetic anti-ferromagnetic (SAF) structure (e.g. a balanced SAF structure), a free magnetic layer structure 204, and a magnetic layer structure 206, arranged one over the other. The SAF structure 202 may reduce stray magnetic field that may act on the free magnetic layer structure 204. The fixed magnetic layer structure 202, the free magnetic layer structure 204 and the offsetting magnetic layer structure 206 may form part of a magnetic junction of the magnetoresistive device 200.

The free magnetic layer structure 204 may be arranged or sandwiched in between the SAF structure 202 and the offsetting magnetic layer structure 206. As shown in FIG. 2, the offsetting magnetic layer structure 206 with perpendicular anisotropy may be applied or arranged above or on top of the free magnetic layer structure 204 for the magnetoresistive device (e.g. in-plane STT-MRAM) 200.

The fixed magnetic layer structure 202 may have a fixed magnetization orientation and the free magnetic layer structure 204 may have a variable or free magnetization orientation.

The fixed magnetic layer structure (SAF structure) 202 includes two antiferromagnetically coupled ferromagnetic layers, in the form of a first ferromagnetic layer 208a and a second ferromagnetic layer 208b, with in-plane anisotropy (along a direction as represented by the arrow 232), with oppositely oriented magnetization directions or orientations, pinned by an anti-ferromagnetic (AFM) layer 210. The respective arrows shown within the first ferromagnetic layer 208a and the second ferromagnetic layer 208b of the antiferromagnetically coupled ferromagnetic layers illustrate the direction of magnetization orientation of each of the first ferromagnetic layer 208a and the second ferromagnetic layer 208b. In various embodiments, the perpendicular offset magnetic layer 206 may tilt the easy axis of the free magnetic layer structure (free layer) 204 from the in-plane direction or axis 203.

A metal spacer layer 212, for example a conductive and non-magnetic spacer layer (e.g. ruthenium (Ru)) may be sandwiched in between the first ferromagnetic layer 208a and the second ferromagnetic layer 208b. As a non-limiting example, the SAF structure 202 may have a structure or arrangement having the first ferromagnetic layer 208a and the second ferromagnetic layer 208b, with the spacer layer 212 having Ruderman-Mittel-Kasuya-Yosida (RKKY) coupling, such as but not limited to ruthenium (Ru), sandwiched in between the first ferromagnetic layer 208a and the second ferromagnetic layer 208b. The first ferromagnetic layer 208a (e.g. a layer of cobalt (Co)) may be an in-plane reference layer while the second ferromagnetic layer 208b (e.g. a layer of cobalt (Co)) may be an in-plane pinned layer, and in contact with the AFM layer 210.

By employing the spacer layer 212 with an appropriate thickness, for example about 5 nm or less, for example between about 0.5 nm and about 5 nm, between about 0.5 nm and about 3 nm or between about 3 nm and about 5 nm, the magnetization orientations of the first ferromagnetic layer 208a and the second ferromagnetic layer 208b may be anti-aligned (i.e. the layers are antiferromagnetically coupled). It should be appreciated that the appropriate thickness may be different for different metals of the spacer layer 212.

The AFM layer 210 may include a material including but not limited to X-manganese or X-Y-manganese, wherein each of X and Y includes but not limited to platinum (Pt), palladium (Pd), iridium (Ir), rhodium (Rh), ruthenium (Ru) or iron (Fe).

The offsetting magnetic layer structure 206 may be configured such that its axis (e.g. easy axis) 201 or magnetization orientation is oriented in a direction substantially perpendicular or orthogonal to the magnetic anisotropy of the SAF structure 202, or substantially parallel to the direction 230. The arrow shown within the offsetting magnetic layer structure 206 illustrates the direction of the magnetization orientation of the offsetting magnetic layer structure 206, which is the upward direction.

The free magnetic layer structure 204 may have a magnetization orientation with an in-plane axis (e.g. easy axis) 203 along the direction as represented by the arrow 232, being perpendicular to the thickness direction 230. Therefore, the axis 201 of the magnetization orientation of the offsetting magnetic layer structure 206 may be at least substantially non-parallel (e.g. being orthogonal) to any one of or each of the axis of the magnetization orientation of the SAF structure 202 or the axis 203.

The magnetoresistive device 200 includes a spacer layer 214 arranged in between the fixed magnetic layer structure 202 and the free magnetic layer structure 204, for example of a non-conductive and non-magnetic material (e.g. an insulator), e.g. magnesium oxide (MgO). However, it should be appreciated that other materials such as aluminum oxide (AlO$_x$), or titanium oxide (TiO$_x$) may also be used. The magnetoresistive device 200 may therefore be configured as a tunneling magnetoresistive (TMR) device.

However, it should be appreciated that the magnetoresistive device 200 may be configured as a giant magnetoresistive (GMR) device, with the spacer layer 214 having a conductive and non-magnetic material (e.g. a conductor), e.g. one or more of Cu, Ag, Au, Ta, Cr, Pd, Pt, Ir, Rh or Ru.

The magnetoresistive device 200 includes a spacer layer (SL) 216 arranged in between the free magnetic layer structure 204 and the offsetting magnetic layer structure 206, for example a non magnetic spacer layer, for example of a conductive and non-magnetic material (e.g. a conductor). The spacer layer 216 may include a material including but not limited to tantalum (Ta), palladium (Pd), platinum (Pt), ruthenium (Ru), rhodium (Rh), hafnium (Hf), zirconium (Zr), iridium (Ir), osmium (Os), titanium (Ti), vanadium (V), chromium (Cr) or any combination thereof. In various embodiments, the spacer layer 216 may include copper (Cu) which may have a spin diffusion length in the micrometer scale. In various embodiments, the spacer layer 216 may have a thickness of between about 1 nm and about 15 nm.

In various embodiments, the static field from the offsetting magnetic layer structure 206 may offset the non-transitory magnetization of the free magnetic layer structure 204, for example changing the axis of the non-transitory magnetization orientation of the free magnetic layer structure 204, towards out of plane direction relative to the magnetization or the axis of the magnetization orientation of the fixed magnetic layer structure (SAF structure) 202. In other words, the non-transitory magnetization orientation of the free magnetic layer structure 204 may be offset from the initial axis or easy axis 203 to an offset axis 205, which between the initial axis or easy axis 203 and the offset axis 205, angle (e.g. an acute angle), θ, may be provided or defined.

As a result, the free magnetic layer structure 204 may have its non-transitory magnetization orientation offset from the easy axis 203. In other words, the non-transitory magnetization orientation of the free magnetic layer structure 204 may be along an axis 205 that is oriented at a non-zero angle (e.g. acute angle) θ relative to the easy axis 203 and the easy axis of the fixed magnetic layer structure (SAF structure) 202, thereby providing an off aligned free layer 204. As shown in FIG. 2, the arrow shown within the free magnetic layer structure 204 illustrates the direction of the offset non-transitory magnetization orientation of the free magnetic layer structure 204, being substantially towards the upwardly right direction.

The illustration shown in FIG. 2 may for example be the initial state of the magnetoresistive device 200.

It should be appreciated that the magnetization orientation of the offsetting magnetic layer structure 206 may point in the downward direction, such that the offset non-transitory magnetization orientation of the free magnetic layer structure 204 may be oriented towards the downwardly right direction.

In further embodiments, the offsetting magnetic layer structure 206 with perpendicular anisotropy may be applied or arranged below the free magnetic layer structure 204 for a magnetoresistive device having a top pinned MTJ structure or arrangement, in which the order or sequence of the different layers may be reversed or opposite, such that the SAF structure 202 and the AFM layer 210 are arranged towards the top, as compared to the magnetoresistive device 200, as illustrated in FIG. 2, having a bottom pinned MTJ structure.

In various embodiments, the static field from the offsetting magnetic layer structure 206 on the free magnetic layer structure 204, and therefore the offset angle θ, may be controlled or varied by tuning the materials of the offsetting magnetic layer structure 206 and/or the distance (or spacing) between the offsetting magnetic layer structure 206 and the free magnetic layer structure 204 (for example varying the thickness of the spacer layer 216) and/or the size of the magnetoresistive device 200.

As the fixed magnetic layer structure (SAF structure) 202 or the first ferromagnetic layer 208a is further away or distal from the offsetting magnetic layer structure 206, the corresponding magnetization may remain in the film plane (in-plane), along the direction 232, or at least has an offset angle that may be different (e.g. smaller) as compared to the offset angle θ of that for the offset non-transitory magnetization orientation of the free magnetic layer structure 204. Therefore, the axis 205 of the non-transitory magnetization orientation of the free magnetic layer structure 204 and the easy axis of the magnetization of the fixed magnetic layer structure 202 (or the first ferromagnetic layer 208a) may be off aligned relative to each other, for example by a non-zero angle (e.g. an acute angle) θ.

Accordingly, the magnetoresistive device 200 (e.g. an in-plane STT-MRAM) may have a magnetic tunnel junction (MTJ) stack structure having an off aligned/offset free layer, FL (the free magnetic layer structure 204) and an additional magnetic layer, ML, in the form of the offsetting magnetic layer structure 206.

In the context of various embodiments, the spacer layer 216 may be of a material with a short spin diffusion length so as to eliminate or at least minimise the spin current from the offsetting magnetic layer structure 206 and minimize the side STT effect from the offsetting magnetic layer structure 206 in order to achieve a better or enhanced critical switching current density, $J_c$, uniformity and less noise.

FIGS. 3A to 3D show schematic cross-sectional views of respective magnetoresistive devices 300, 320, 340, 360, with perpendicular anisotropy, for achieving a better scalability, according to various embodiments. The magnetoresistive devices 300, 320, 340, 360, may respectively be a 1-bit per cell magnetic random access memory (MRAM). The magnetoresistive devices 300, 320, 340, 360, may respectively be a tunneling magnetoresistive (TMR) device, e.g. a spin transfer torque magnetic random access memory (STT-MRAM) with perpendicular anisotropy. The magnetoresistive devices 300, 320, 340, 360, may respectively have a stack arrangement, having for example a plurality of ferromagnetic layers.

Figure 3A:
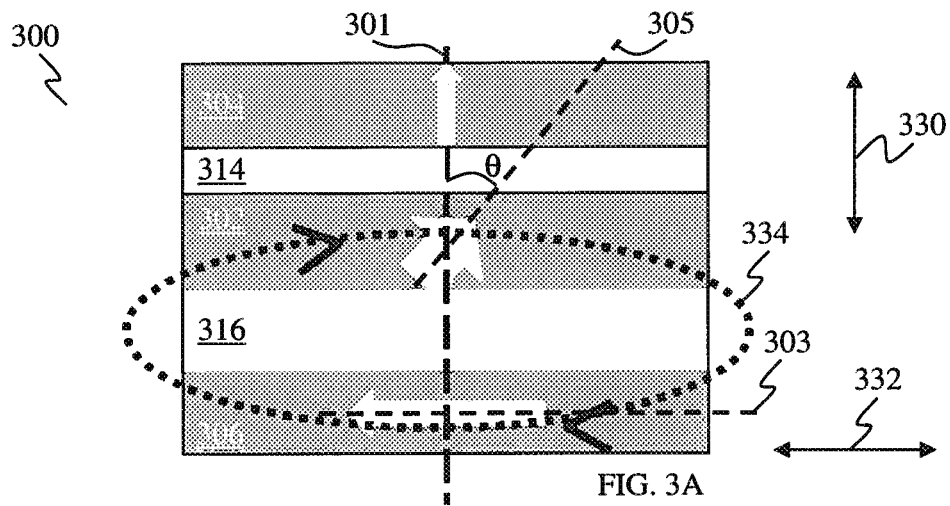
FIGS. 3A to 3D show schematic cross-sectional views of respective magnetoresistive devices with perpendicular anisotropy, according to various embodiments.

With reference to FIG. 3A, the magnetoresistive device 300 includes a fixed magnetic layer structure (reference layer; RL) 302, a free magnetic layer structure (free layer; FL) 304, and an offsetting magnetic layer structure (magnetic layer; ML) 306, arranged one over the other. The fixed magnetic layer structure 302, the free magnetic layer structure 304 and the offsetting magnetic layer structure 306 may form part of a magnetic junction of the magnetoresistive device 300.

The fixed magnetic layer structure 302 may be arranged or sandwiched in between the free magnetic layer structure 304 and the offsetting magnetic layer structure 306. As shown in FIG. 3A, the offsetting magnetic layer structure 306 with in-plane anisotropy may be applied or arranged below the fixed magnetic layer structure 302 for the magnetoresistive device (e.g. perpendicular STT-MRAM) 300.

The fixed magnetic layer structure 302 may have a fixed magnetization orientation and the free magnetic layer structure 304 may have a variable or free magnetization orientation.

The free magnetic layer structure 304 may have a magnetization orientation with a perpendicular axis (e.g. easy axis) 301, along the direction as represented by the arrow 330, being parallel to the thickness direction. As shown in FIG. 3A, the arrow shown within the free magnetic layer structure 304 illustrates the magnetization orientation of the free magnetic layer structure 304. While the arrow is shown pointing in an upward direction to represent the magnetization orientation of the free magnetic layer structure 304 being oriented in an upwardly direction, it should be appreciated that the arrow may be illustrated as pointing in a downward direction, such that a magnetization orientation in the opposite direction to that of the embodiment of FIG. 3A may be provided for the free magnetic layer structure 304.

The offsetting magnetic layer structure 306 may be configured such that its axis (e.g. easy axis) 303 or magnetization orientation is oriented in a direction substantially perpendicular or orthogonal to the magnetic anisotropy of the free magnetic layer structure 304 and the thickness direction 330, or substantially parallel to the direction 332, thereby having in-plane anisotropy. The arrow shown within the offsetting magnetic layer structure 306 illustrates the direction of the magnetization orientation of the offsetting magnetic layer structure 306, which is towards the left direction.

The fixed magnetic layer structure 302 may have a magnetization orientation with a perpendicular axis (e.g. easy axis) 301 along the direction 330, along the thickness direction. Therefore, the axis 303 of the magnetization orientation of the offsetting magnetic layer structure 306 may be at least substantially non-parallel (e.g. being orthogonal) to the axis 301.

The magnetoresistive device 300 includes a spacer layer 314 arranged in between the fixed magnetic layer structure 302 and the free magnetic layer structure 304. The spacer layer 314 may be of a non-conductive and non-magnetic material (e.g. an insulator), for example magnesium oxide (MgO). However, it should be appreciated that other materials such as aluminum oxide ($AlO_x$), or titanium oxide ($TiO_x$) may also be used. The magnetoresistive device 300 may therefore be configured as a tunneling magnetoresistive (TMR) device.

However, it should be appreciated that the magnetoresistive device 300 may be configured as a giant magnetoresistive (GMR) device, with the spacer layer 314 having a conductive and non-magnetic material (e.g. a conductor), e.g. one or more of Cu, Ag, Au, Ta, Cr, Pd, Pt, Ir, Rh or Ru.

The magnetoresistive device 300 further includes a spacer layer (SL) 316 arranged in between the fixed magnetic layer structure 302 and the offsetting magnetic layer structure 306. The spacer layer 316 may be of a material with a short spin diffusion length so as to eliminate or at least minimise the spin current from the offsetting magnetic layer structure 306 and minimize the side STT effect from the offsetting magnetic layer structure 306 in order to achieve a better or enhanced critical switching current density, $J_c$, uniformity and less noise. The spacer layer 316 may be a non magnetic spacer layer, for example of a conductive and non-magnetic material (e.g. a conductor). The spacer layer 316 may include a material including but not limited to tantalum (Ta), palladium (Pd), platinum (Pt), ruthenium (Ru), rhodium (Rh), hafnium (Hf), zirconium (Zr), iridium (Ir), osmium (Os), titanium (Ti), vanadium (V), chromium (Cr) or any combination thereof. In various embodiments, the spacer layer 316 may include copper (Cu) which may have a spin diffusion length in the micrometer scale. In various embodiments, the spacer layer 316 may have a thickness of between about 1 nm and about 15 nm.

In various embodiments, the static field from the offsetting magnetic layer structure 306 may offset the magnetization of the fixed magnetic layer structure 302, for example changing the axis of the magnetization orientation of the fixed magnetic layer structure 302, towards out of plane direction relative to the respective magnetizations or the respective easy axes 301 of the fixed magnetic layer structure 302 and the free magnetic layer structure 304. In other words, the magnetization orientation of the fixed magnetic layer structure 302 may be offset from the initial axis or easy axis 301 to an offset axis 305, which between the initial axis or easy axis 301 and the offset axis 305, an angle (e.g. an acute angle), θ, may be provided or defined. The dotted arrow as represented by 334 illustrates the effect of the static field from the offsetting magnetic layer structure 306 in offsetting the magnetization orientation of the fixed magnetic layer structure 302.

As a result, the fixed magnetic layer structure 302 may have its magnetization orientation offset from the easy axis 301. In other words, the magnetization orientation of the fixed magnetic layer structure 302 may be along an axis 305 that is oriented at a non-zero angle (e.g. acute angle) θ relative to the easy axis 301, thereby providing an off aligned reference layer 302. As shown in FIG. 3A, the arrow shown within the fixed magnetic layer structure 302 illustrates the direction of the offset magnetization orientation of the fixed magnetic layer structure 302, being substantially towards the upwardly right direction.

However, it should be appreciated that the magnetization orientation of the offsetting magnetic layer structure 306 may point in the right direction, such that the magnetization orientation of the fixed magnetic layer structure 302 may be oriented towards the upwardly left direction.

The illustration shown in FIG. 3A may for example be the initial state of the magnetoresistive device 300.

In various embodiments, the static field from the offsetting magnetic layer structure 306 on the fixed magnetic layer structure 302 may be controlled or varied by tuning the materials of the offsetting magnetic layer structure 306 and/or the distance (or spacing) between the offsetting magnetic layer structure 306 and the fixed magnetic layer structure 302 (for example varying the thickness of the spacer layer 316) and/or the size of the magnetoresistive device 300.

As the free magnetic layer structure 304 is further away or distal from the offsetting magnetic layer structure 306, the corresponding magnetization or magnetization orientation may remain along the easy axis 301, or at least has an offset angle that may be different (e.g. smaller) as compared to the offset angle θ of that for the offset magnetization orientation of the fixed magnetic layer structure 302. Therefore, the easy axis 301 of the magnetization orientation of the free magnetic layer structure 304 and the axis 305 of the offset magnetization orientation of the fixed magnetic layer structure 302 may be off aligned relative to each other, for example by a non-zero angle (e.g. an acute angle) θ.

Accordingly, the magnetoresistive device 300 (e.g. a perpendicular STT-MRAM) may have a magnetic tunnel junction (MTJ) stack structure having an off aligned/offset reference layer, RL (the fixed magnetic layer structure 302) and an additional magnetic layer, ML, in the form of the offsetting magnetic layer structure 306. The in-plane offsetting magnetic layer structure 306 and the spacer layer 316 may be arranged below the fixed magnetic layer structure 302 to offset the magnetization of the fixed magnetic layer structure 302 away from the perpendicular axis 301.

Figure 3B:
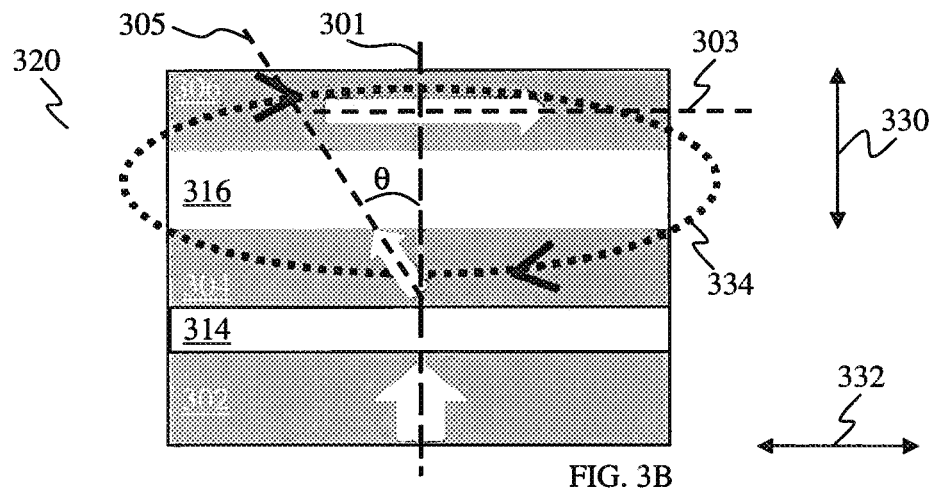

As shown in FIG. 3B, the magnetoresistive device 320 may include a fixed magnetic layer structure 302, a free magnetic layer structure 304, and a magnetic layer structure 306, arranged one over the other, and spacer layers 314, 316, which may be as substantially described in the context of the embodiment of FIG. 3A, except that for the magnetoresistive device 320, the free magnetic layer structure 304 is off aligned.

The free magnetic layer structure 304 may be arranged or sandwiched in between the fixed magnetic layer structure 302 and the offsetting magnetic layer structure 306. As shown in FIG. 3B, the offsetting magnetic layer structure 306 with in-plane anisotropy may be applied or arranged above the free magnetic layer structure 304 for the magnetoresistive device (e.g. perpendicular STT-MRAM) 320.

The free magnetic layer structure 304 may have a magnetization orientation with a perpendicular axis (e.g. easy axis) 301, along the direction 330, being parallel to the thickness direction.

The offsetting magnetic layer structure 306 may be configured such that its axis (e.g. easy axis) 303 or magnetization orientation is oriented in a direction substantially perpendicular or orthogonal to the magnetic anisotropy of the free magnetic layer structure 304 and the thickness direction 330, or substantially parallel to the direction 332, thereby having in-plane anisotropy. The arrow shown within the offsetting magnetic layer structure 306 illustrates the direction of the magnetization orientation of the offsetting magnetic layer structure 306, which is towards the right direction.

The magnetoresistive device 320 includes a spacer layer (SL) 316 arranged in between the free magnetic layer structure 304 and the offsetting magnetic layer structure 306.

In various embodiments, the static field from the offsetting magnetic layer structure 306 may offset the non-transitory magnetization of the free magnetic layer structure 304, for example changing the axis of the non-transitory magnetization orientation of the free magnetic layer structure 304, towards out of plane direction relative to the easy axis 301. In other words, the non-transitory magnetization orientation of the free magnetic layer structure 304 may be offset from the initial axis or easy axis 301 to an offset axis 305, which between the initial axis or easy axis 301 and the offset axis 305, an angle (e.g. an acute angle) θ may be provided or defined. The dotted arrow as represented by 334 illustrates the effect of the static field from the offsetting magnetic layer structure 306 in offsetting the magnetization orientation of the free magnetic layer structure 304.

In various embodiments, the static field from the offsetting magnetic layer structure 306 on the free magnetic layer structure 304 may be controlled or varied by tuning the materials of the offsetting magnetic layer structure 306 and/or the distance (or spacing) between the offsetting magnetic layer structure 306 and the free magnetic layer structure 304 (for example varying the thickness of the spacer layer 316) and/or the size of the magnetoresistive device 320.

As the fixed magnetic layer structure 302 is further away or distal from the offsetting magnetic layer structure 306, the corresponding magnetization or magnetization orientation may remain along the easy axis 301, or at least has an offset angle that may be different (e.g. smaller) as compared to the offset angle θ of that for the offset non-transitory magnetization orientation of the free magnetic layer structure 304. Therefore, the axis 305 of the offset non-transitory magnetization orientation of the free magnetic layer structure 304 and the axis 301 of the magnetization orientation of the fixed magnetic layer structure 302 may be off aligned relative to each other, for example by a non-zero angle (e.g. an acute angle) θ.

As a result, the free magnetic layer structure 304 may have its non-transitory magnetization orientation offset from the easy axis 301. In other words, the offset non-transitory magnetization orientation of the free magnetic layer structure 304 may be along an axis 305 that is oriented at a non-zero angle (e.g. acute angle) relative to the easy axis 301, thereby providing an off aligned free layer 304.

As shown in FIG. 3B, the arrow shown within the free magnetic layer structure 304 illustrates the direction of the offset non-transitory magnetization orientation of the free magnetic layer structure 304, being substantially towards the upwardly left direction.

However, it should be appreciated that the magnetization orientation of the offsetting magnetic layer structure 306 may point in the left direction, such that the offset non-transitory magnetization orientation of the free magnetic layer structure 304 may be oriented towards the upwardly right direction.

The illustration shown in FIG. 3B may for example be the initial state of the magnetoresistive device 320.

Accordingly, the magnetoresistive device 320 (e.g. a perpendicular STT-MRAM) may have a magnetic tunnel junction (MTJ) stack structure having an off aligned/offset free layer, FL (the free magnetic layer structure 304) and an additional magnetic layer, ML, in the form of the offsetting magnetic layer structure 306. The in-plane offsetting magnetic layer structure 306 and the spacer layer 316 may be arranged on top of or over the free magnetic layer structure 304 to offset the magnetization of free magnetic layer structure 304 away from the perpendicular axis 301.

Figure 3C:
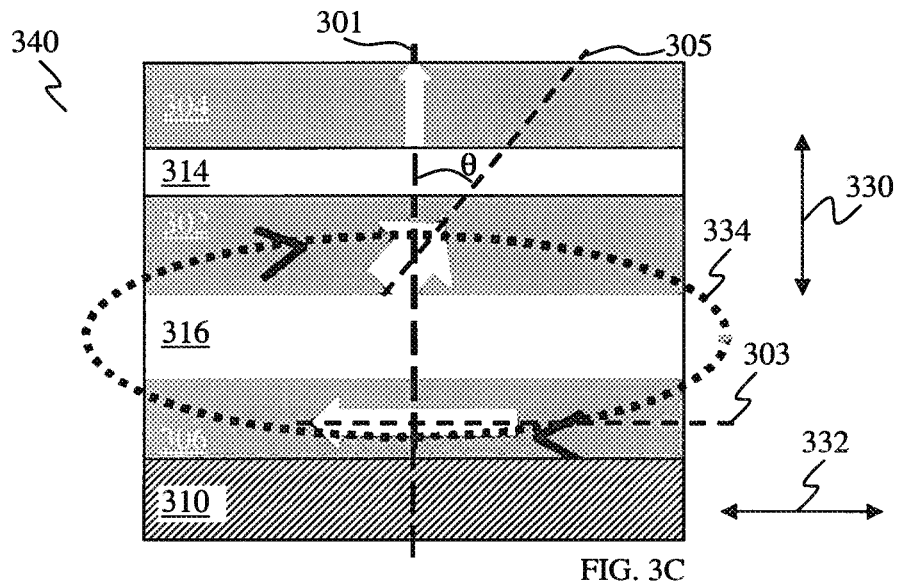

As shown in FIG. 3C, the magnetoresistive device 340 may include a fixed magnetic layer structure 302, a free magnetic layer structure 304, and a magnetic layer structure 306, arranged one over the other, and spacer layers 314, 316, which may be as substantially described in the context of the embodiment of FIG. 3A. The magnetoresistive device 340 further includes an anti-ferromagnetic (AFM) layer 310 where the in-plane offsetting magnetic layer structure 306 may be exchange biased by the ARM layer 310 in order to achieve high stability. The AFM layer 310 may be arranged adjacent to the offsetting magnetic layer structure 306, for example in direct contact. The offsetting magnetic layer structure 306 may be a single magnetic layer or an un-balanced SAF structure in order to achieve higher stability and fine tune the stray field on the fixed magnetic layer structure 302.

Figure 3D:
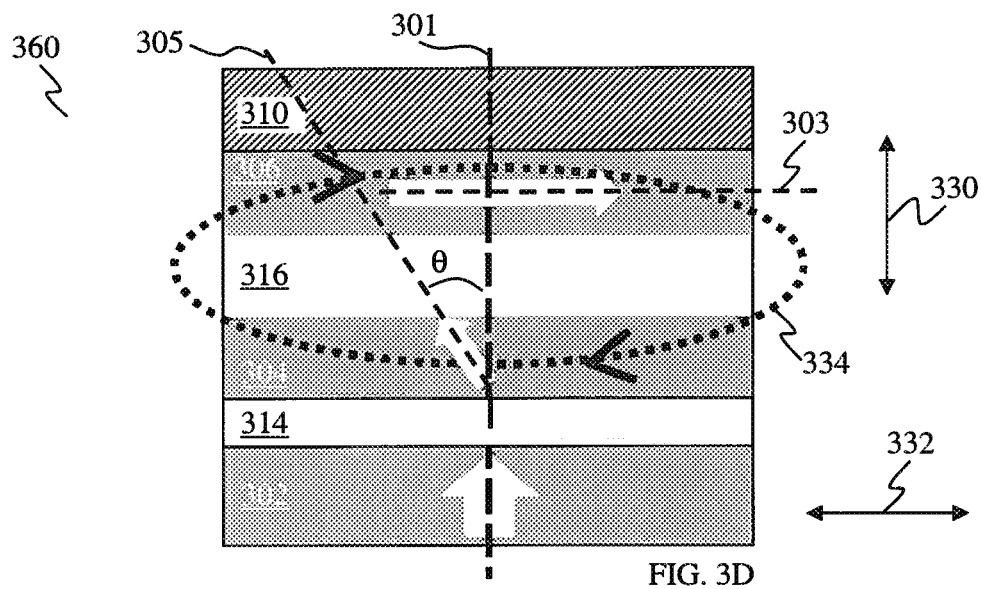

As shown in FIG. 3D, the magnetoresistive device 360 may include a fixed magnetic layer structure 302, a free magnetic layer structure 304, and an offsetting magnetic layer structure 306, arranged one over the other, and spacer layers 314, 316, which may be as substantially described in the context of the embodiment of FIG. 3B. The magnetoresistive device 360 further includes an anti-ferromagnetic (AFM) layer 310 where the in-plane offsetting magnetic layer structure 306 may be exchange biased by the AFM layer 310 in order to achieve high stability. The AFM layer 310 may be arranged adjacent to the offsetting magnetic layer structure 306, for example in direct contact. The offsetting magnetic layer structure 306 may be a single magnetic layer or an un-balanced SAF structure in order to achieve higher stability and fine tune the stray field on the fixed magnetic layer structure 302.

Figure 4A:
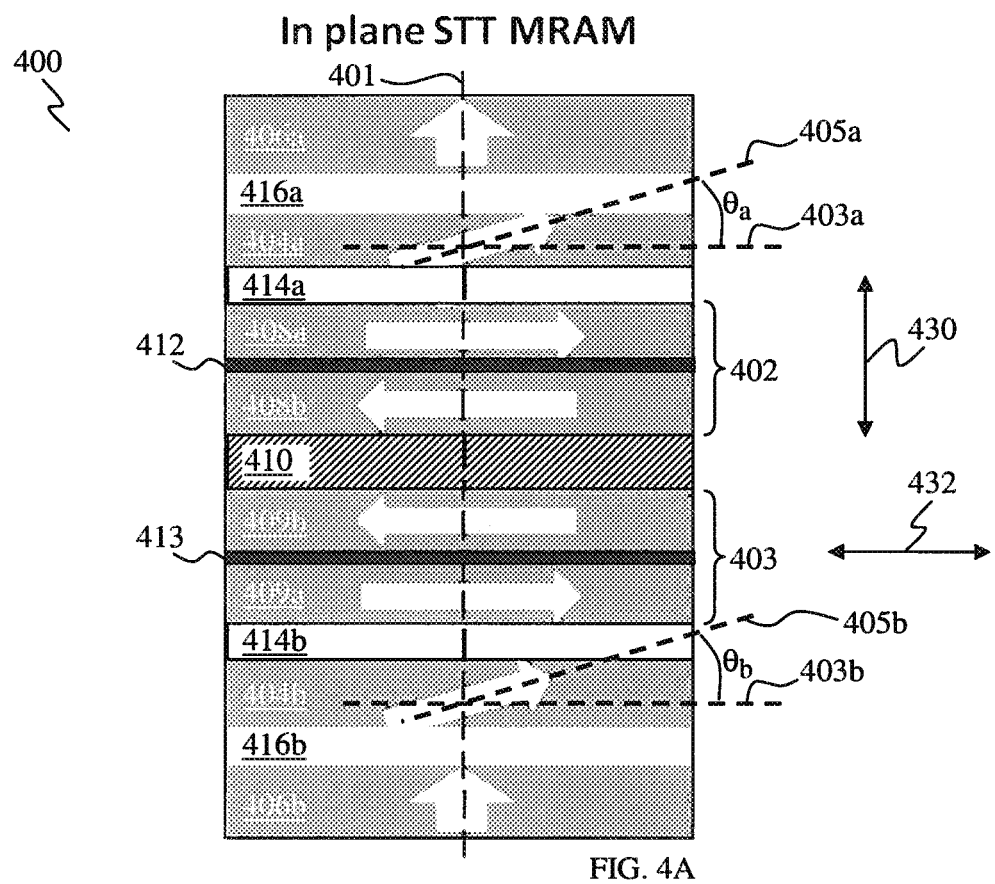
FIG. 4A shows a schematic cross-sectional view of a multi-bit magnetoresistive device with in-plane anisotropy, according to various embodiments.

FIG. 4A shows a schematic cross-sectional view of a multi-bit magnetoresistive device 400 with in-plane anisotropy, according to various embodiments. The magnetoresistive device 400 may be a 2-bit per cell magnetic random access memory (MRAM), e.g. a multilevel STT MRAM. The magnetoresistive device 400 may be a tunneling magnetoresistive (TMR) device, e.g. a spin transfer torque magnetic random access memory (STT-MRAM) with in-plane anisotropy. The magnetoresistive device 400 may have a stack arrangement, having for example a plurality of ferromagnetic layers.

The magnetoresistive device 400 includes a first fixed magnetic layer structure (reference layer; RL1) 402, in the form of a synthetic anti-ferromagnetic (SAF) structure, a second fixed magnetic layer structure (reference layer; RL2) 403, in the form of a synthetic anti-ferromagnetic (SAF) structure, a first free magnetic layer structure (free layer; FL1) 404a, a second free magnetic layer structure (free layer; FL2) 404b, a first offsetting magnetic layer structure (magnetic layer; MLA) 406a and a second offsetting magnetic layer structure (magnetic layer; ML2) 446b, arranged one over the other. The first fixed magnetic layer structure 402, the second fixed magnetic layer structure 403, the first free magnetic layer structure 404a, the second free magnetic layer structure 404b, the first offsetting magnetic layer structure 406a and the second offsetting magnetic layer structure 406b may form part of a magnetic junction of the magnetoresistive device 400.

The first SAF structure 402 may reduce the stray magnetic field that may act on the first free magnetic layer structure 404a. The second SAF structure 403 may reduce the stray magnetic field that may act on the second free magnetic layer structure 404b.

The first SAF structure 402 and the second SAF structure 403 may be arranged adjacent to each other. Each of the first SAF structure 402 and the second SAF structure 403 may be arranged or sandwiched in between the first free magnetic layer structure 404a and the second free magnetic layer structure 404b. The first free magnetic layer structure 404a may be arranged or sandwiched in between the first SAF structure 402 and the first offsetting magnetic layer structure 406a. The second free magnetic layer structure 404b may be arranged or sandwiched in between the second SAF structure 403 and the second offsetting magnetic layer structure 406b. As shown in FIG. 4A, the first offsetting magnetic layer structure 406a with perpendicular anisotropy may be applied or arranged above or on top of the first free magnetic layer structure 404a and the second offsetting magnetic layer structure 406b with perpendicular anisotropy may be applied or arranged below the second free magnetic layer structure 404b, for the magnetoresistive device (e.g. perpendicular STT-MRAM) 400.

Each of the first fixed magnetic layer structure 402 and the second fixed magnetic layer structure 403 may have a fixed magnetization orientation and each of the first free magnetic layer structure 404a and the second free magnetic layer structure 404b may have a variable or free magnetization orientation.

The first SAF structure 402 may be an in-plane SAF, and includes two antiferromagnetically coupled ferromagnetic layers with in-plane anisotropy (along a direction as represented by the arrow 432), in the form of a first ferromagnetic layer 408a, which may be as substantially described in the context of the first ferromagnetic layer 208a (FIG. 2), and a second ferromagnetic layer 408b, which may be as substantially described in the context of the second ferromagnetic layer 208b (FIG. 2), with oppositely oriented magnetization directions or orientations, pinned by an anti-ferromagnetic (AFM) layer 410, which may be as substantially described in the context of the AFM layer 210 (FIG. 2). A non-magnetic spacer layer 412 may be sandwiched in between the first ferromagnetic layer 408a and the second ferromagnetic layer 408b. The spacer layer 412 may be as substantially described in the context of the spacer layer 212 (FIG. 2).

In various embodiments, the first SAF structure 402 may be an un-balanced SAF structure and may have a net magnetization orientation pointing in the direction towards the right. Therefore, the first SAF structure 402 may have a net magnetization orientation with an in-plane axis (e.g. easy axis) along the direction 432.

The second SAF structure 403 may be an in-plane SAF, and includes two antiferromagnetically coupled ferromagnetic layers with in-plane anisotropy (along a direction as represented by the arrow 432), in the form of a first ferromagnetic layer 409a, which may be as substantially described in the context of the first ferromagnetic layer 208a (FIG. 2), and a second ferromagnetic layer 409b, which may be as substantially described in the context of the second ferromagnetic layer 208b (FIG. 2), with oppositely oriented magnetization directions or orientations, pinned by the anti-ferromagnetic (AFM) layer 410, which may be as substantially described in the context of the AFM layer 210 (FIG. 2). A non-magnetic spacer layer 413 may be sandwiched in between the first ferromagnetic layer 409a and the second ferromagnetic layer 409b. The spacer layer 413 may be as substantially described in the context of the spacer layer 212 (FIG. 2).

In various embodiments, the second SAF structure 403 may be an un-balanced SAF structure and may have a net magnetization orientation pointing in the direction towards the right. Therefore, the second SAF structure 403 may have a net magnetization orientation with an in-plane axis (e.g. easy axis) along the direction 432.

The first free magnetic layer structure 404a may have a magnetization orientation with an in-plane axis (e.g. easy axis) 403a and the second free magnetic layer structure 404b may have a magnetization orientation with an in-plane axis (e.g. magnetic easy axis) 403b, along the direction as represented by the arrow 432, being perpendicular to the thickness direction, as represented by the arrow 430.

Each of the first offsetting magnetic layer structure 406a and the second offsetting magnetic layer structure 406b may be configured such that their respective axes (e.g. easy axis) 401 or their respective magnetization orientations are oriented in a direction substantially perpendicular or orthogonal to the magnetic anisotropy of the first free magnetic layer structure 404a and the second free magnetic layer structure 404b and the direction 432, or substantially parallel to the direction 430, thereby having perpendicular anisotropy. The respective arrows shown within each of the first offsetting magnetic layer structure 406a and the second offsetting magnetic layer structure 406b illustrate the directions of the respective magnetization orientations of the first offsetting magnetic layer structure 406a and the second offsetting magnetic layer structure 406b, which are towards the upward direction.

The magnetoresistive device 400 includes a spacer layer 414a arranged in between the first fixed magnetic layer structure 402 and the first free magnetic layer structure 404a. The magnetoresistive device 400 further includes a spacer layer 414b arranged in between the second fixed magnetic layer structure 403 and the second free magnetic layer structure 404b. Any one of or each of the spacer layers 414a, 414b, may be of a non-conductive and non-magnetic material (e.g. an insulator), for example magnesium oxide (MgO). However, it should be appreciated that other materials such as aluminum oxide ($AlO_x$), or titanium oxide ($TiO_x$) may also be used. The magnetoresistive device 400 may therefore be configured as a tunneling magnetoresistive (TMR) device.

However, it should be appreciated that the magnetoresistive device 400 may be configured as a giant magnetoresistive (GMR) device, with each of the spacer layers 414a, 414b having a conductive and non-magnetic material (e.g. a conductor), e.g. one or more of Cu, Ag, Au, Ta, Cr, Pd, Pt, Ir, Rh or Ru.

The magnetoresistive device 400 further includes a non-magnetic spacer layer 416a arranged in between the first free magnetic layer structure 404a and the first offsetting magnetic layer structure 406a. The magnetoresistive device 400 further includes a spacer layer 416b arranged in between the second free magnetic layer structure 404b and the second offsetting magnetic layer structure 406b. Each of the spacer layers 416a, 416b, may be of a material with a short spin diffusion length so as to eliminate or at least minimise the spin current from the first offsetting magnetic layer structure 406a and the second offsetting magnetic layer structure 406b respectively and minimize the side STT effect from the first offsetting magnetic layer structure 406a and the second offsetting magnetic layer structure 406b respectively in order to achieve a better or enhanced critical switching current density, $J_c$, uniformity and less noise. Any one of or each of the spacer layers 416a, 416b, may be a non magnetic spacer layer, for example of a conductive and non-magnetic material (e.g. a conductor) such as a material including but not limited to tantalum (Ta), palladium (Pd), platinum (Pt), ruthenium (Ru), rhodium (Rh), hafnium (Hf), zirconium (Zr), iridium (Ir), osmium (Os), titanium (Ti), vanadium (V), chromium (Cr) or any combination thereof. In various embodiments, any one of or each of the spacer layers 416a, 416b, may include copper (Cu) which may have a spin diffusion length in the micrometer scale. In various embodiments, any one of or each of the spacer layers 416a, 416b may have a thickness of between about 1 nm and about 15 nm.

In various embodiments, the static field from the first offsetting magnetic layer structure 406a may offset the magnetization of the first free magnetic layer structure 404a, for example changing the axis of the non-transitory magnetization orientation of the first free magnetic layer structure 404a towards out of plane direction relative to the easy axis 403a. In other words, the non-transitory magnetization orientation of the first free magnetic layer structure 404a may be offset from the initial axis or easy axis 403a to an offset axis 405a, which between the initial axis or easy axis 403a and the offset axis 405a, an angle (e.g. an acute angle) $\theta_a$ may be provided or defined.

In various embodiments, the static field from the first offsetting magnetic layer structure 406a on the first free magnetic layer structure 404a may be controlled or varied by tuning the materials of the first offsetting magnetic layer structure 406a and/or the distance (or spacing) between the first offsetting magnetic layer structure 406a and the first free magnetic layer structure 404a (for example varying the thickness of the spacer layer 416a) and/or the size of the magnetoresistive device 400.

As the first fixed magnetic layer structure 402 is further away or distal from the first offsetting magnetic layer structure 406a, the corresponding magnetization or magnetization orientation may remain along its easy axis at least substantially parallel to the direction 432, or at least has an offset angle that may be different (e.g. smaller) as compared to the offset angle $\theta_a$ of that for the offset non-transitory magnetization of the first free magnetic layer structure 404a. Therefore, the axis 405a of the offset non-transitory magnetization orientation of the first free magnetic layer structure 404a and the axis of the first fixed magnetic layer structure 402 may be off aligned relative to each other, for example by a non-zero angle (e.g. an acute angle) $\theta_a$.

In various embodiments, the static field from the second offsetting magnetic layer structure 406b may offset the magnetization of the second free magnetic layer structure 404b, for example changing the axis of the non-transitory magnetization orientation of the second free magnetic layer structure 404b, towards out of plane direction relative to the easy axis 403b. In other words, the non-transitory magnetization orientation of the second free magnetic layer structure 404b may be offset from the initial axis or easy axis 403b to an offset axis 405b, which between the initial axis or easy axis 403b and the offset axis 405b, an angle (e.g. an acute angle) $\theta_b$ may be provided or defined.

In various embodiments, the static field from the second offsetting magnetic layer structure 406b on the second free magnetic layer structure 404b may be controlled or varied by tuning the materials of the second offsetting magnetic layer structure 406b and/or the distance (or spacing) between the second offsetting magnetic layer structure 406b and the second free magnetic layer structure 404b (for example varying the thickness of the spacer layer 416b) and/or the size of the magnetoresistive device 400.

As the second fixed magnetic layer structure 403 is further away or distal from the second offsetting magnetic layer structure 406b, the corresponding magnetization or magnetization orientation may remain along its easy axis at least substantially parallel to the direction 432, or at least has an offset angle that may be different (e.g. smaller) as compared to the offset angle $\theta_b$ of that for the offset non-transitory magnetization of the second free magnetic layer structure 404b. Therefore, the axis 405b of the offset non-transitory magnetization orientation of the second free magnetic layer structure 404b and the axis of the magnetization orientation of the second fixed magnetic layer structure 403 may be off aligned relative to each other, for example by a non-zero angle (e.g. an acute angle) $\theta_b$. In various embodiments, $\theta_a = \theta_b$.

As a result, the first free magnetic layer structure 404a and the second free magnetic layer structure 404b may have their respective non-transitory magnetization orientations offset from the respective easy axes 403a, 403b. In other words, the respective offset non-transitory magnetization orientations of the first free magnetic layer structure 404a and the second free magnetic layer structure 404b may be along the respective axes 405a, 405b that are oriented at a non-zero angle (e.g. acute angle) relative to the respective easy axes 403a, 403b, thereby providing an off aligned first free layer 404a and an off aligned second free layer 404b.

As shown in FIG. 4A, the arrows shown within the first free magnetic layer structure 404a and the second free magnetic layer structure 404b illustrate the directions of the respective offset non-transitory magnetization orientations of the first free magnetic layer structure 404a and the second free magnetic layer structure 404b, being substantially towards the upwardly right direction.

However, it should be appreciated that the magnetization orientation of the first offsetting magnetic layer structure 406a may point in the downward direction, such that the offset non-transitory magnetization orientation of the first free magnetic layer structure 444a may be oriented towards the downwardly right direction, and/or the magnetization orientation of the second offsetting magnetic layer structure 406b may point in the downward direction, such that the offset non-transitory magnetization orientation of the second free magnetic layer structure 404b may be oriented towards the downwardly right direction.

The illustration shown in FIG. 4A may for example be the initial state of the magnetoresistive device 400.

Accordingly, the magnetoresistive device 400 (e.g. an in-plane STT-MRAM) may have a magnetic tunnel junction (MTJ) stack structure having off aligned/offset free layers (the first free magnetic layer structure 404a and the second free magnetic layer structure 404b) and additional magnetic layers (MLs), in the form of the first offsetting magnetic layer structure 406a and the second offsetting magnetic layer structure 406b. The first perpendicular offsetting magnetic layer structure 406a may be arranged on top of or over the first free magnetic layer structure 404a to offset the magnetization of the first free magnetic layer structure 404a away from the in-plane axis 403a. The second perpendicular offsetting magnetic layer structure 406b may be arranged below the second free magnetic layer structure 404b to offset the magnetization of the second free magnetic layer structure 404b away from the in-plane axis 403b.

Figure 4B:
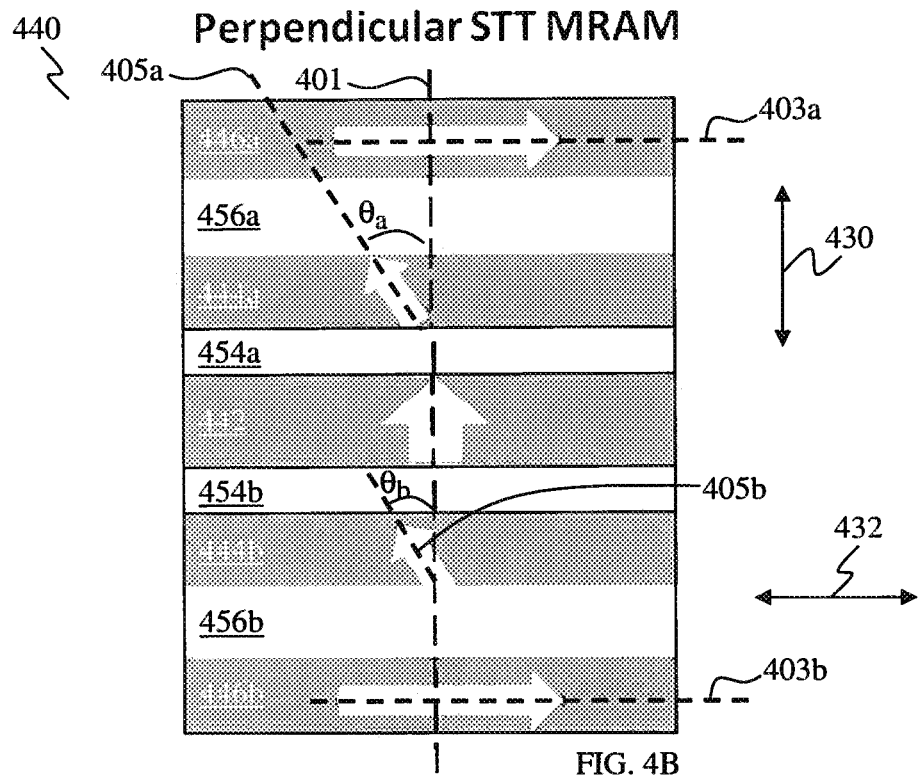
FIGS. 4B and 4C show schematic cross-sectional views of respective multi-bit magnetoresistive devices with perpendicular anisotropy, according to various embodiments.
Figure 4C:
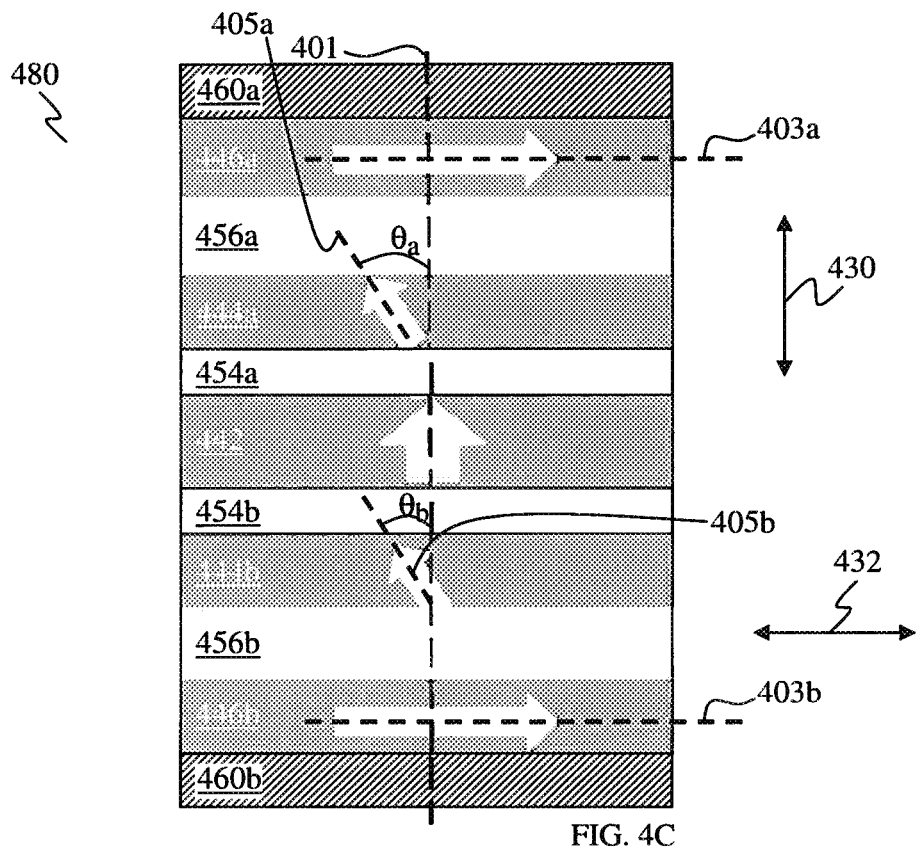

FIGS. 4B and 4C show schematic cross-sectional views of respective multi-bit magnetoresistive devices 440, 480, with perpendicular anisotropy, according to various embodiments. The magnetoresistive devices 440, 480, may respectively be a 2-bit per cell magnetic random access memory (MRAM), e.g. a multilevel STT MRAM. The magnetoresistive devices 440, 480, may respectively be a tunneling magnetoresistive (TMR) device, e.g. a spin transfer torque magnetic random access memory (STT-MRAM) with perpendicular anisotropy. The magnetoresistive devices 440,480, may respectively have a stack arrangement, having for example a plurality of magnetic or ferromagnetic layers.

The magnetoresistive device 440 includes a fixed magnetic layer structure (reference layer; RL) 442, a first free magnetic layer structure (free layer; FL1) 444a, a second free magnetic layer structure (free layer; FL2) 444b, a first offsetting magnetic layer structure (magnetic layer; ML1) 446a and a second offsetting magnetic layer structure (magnetic layer; ML2) 446b, arranged one over the other. The fixed magnetic layer structure 442, the first free magnetic layer structure 444a, the second free magnetic layer structure 444b, the first offsetting magnetic layer structure 446a and the second offsetting magnetic layer structure 446b may form part of a magnetic junction of the magnetoresistive device 440.

The fixed magnetic layer structure 442 may be arranged or sandwiched in between the first free magnetic layer structure 444a and the second free magnetic layer structure 444b. The first free magnetic layer structure 444a may be arranged or sandwiched in between the fixed magnetic layer structure 442 and the first offsetting magnetic layer structure 446a. The second free magnetic layer structure 444b may be arranged or sandwiched in between the fixed magnetic layer structure 442 and the second offsetting magnetic layer structure 446b. As shown in FIG. 4B, the first offsetting magnetic layer structure 446a with in-plane anisotropy may be applied or arranged above the first free magnetic layer structure 444a and the second offsetting magnetic layer structure 446b with in-plane anisotropy may be applied or arranged below the second free magnetic layer structure 444b, for the magnetoresistive device (e.g. perpendicular STT-MRAM) 440.

The fixed magnetic layer structure 442 may have a fixed magnetization orientation and each of the first free magnetic layer structure 444a and the second free magnetic layer structure 444b may have a variable or free magnetization orientation.

Each of the first free magnetic layer structure 444a and the second free magnetic layer structure 444b may have a magnetization orientation with a perpendicular axis (e.g. easy axis) 401, along the direction as represented by the arrow 430, being parallel to the thickness direction.

Each of the first offsetting magnetic layer structure 446a and the second offsetting magnetic layer structure 446b may be configured such that their respective axes (e.g. easy axis) 403a, 403b or their respective magnetization orientations are oriented in a direction substantially perpendicular or orthogonal to the magnetic anisotropy of the first free magnetic layer structure 444a and the second free magnetic layer structure 444b and the thickness direction 430, or substantially parallel to the direction 432, thereby having in-plane anisotropy. The respective arrows shown within each of the first offsetting magnetic layer structure 446a and the second offsetting magnetic layer structure 446b illustrate the directions of the respective magnetization orientations of the first offsetting magnetic layer structure 446a and the second offsetting magnetic layer structure 446b, which are towards the right direction.

The fixed magnetic layer structure 442 may have a magnetization orientation with a perpendicular axis (e.g. easy axis) 401 along the direction 430, along the thickness direction. Therefore, the respective axes 403a, 403b, may be at least substantially non-parallel (e.g. being orthogonal) to the axis 401.

The magnetoresistive device 440 includes a spacer layer 454a arranged in between the fixed magnetic layer structure 442 and the first free magnetic layer structure 441a. The magnetoresistive device 440 further includes a spacer layer 454b arranged in between the fixed magnetic layer structure 442 and the second free magnetic layer structure 444b. Any one of or each of the spacer layers 454a, 454b, may be of a non-conductive and non-magnetic material (e.g. an insulator), for example magnesium oxide (MgO). However, it should be appreciated that other materials such as aluminum oxide ($AlO_x$), or titanium oxide ($TiO_x$) may also be used. The magnetoresistive device 440 may therefore be configured as a tunneling magnetoresistive (TMR) device.

However, it should be appreciated that the magnetoresistive device 440 may be configured as a giant magnetoresistive (GMR) device, with each of the spacer layers 454a, 454b having a conductive and non-magnetic material (e.g. a conductor), e.g. one or more of Cu, Ag, Au, Ta, Cr, Pd, Pt, Ir, Rh or Ru.

The magnetoresistive device 440 further includes a spacer layer 456a arranged in between the first free magnetic layer structure 444a and the first offsetting magnetic layer structure 446a. The magnetoresistive device 440 further includes a spacer layer 456b arranged in between the second free magnetic layer structure 444b and the second offsetting magnetic layer structure 446b. Each of the spacer layers 456a, 456b, may be of a material with a short spin diffusion length so as to eliminate or at least minimise the spin current from the first offsetting magnetic layer structure 446a and the second offsetting magnetic layer structure 446b respectively and minimize the side STT effect from the first offsetting magnetic layer structure 446a and the second offsetting magnetic layer structure 446b respectively in order to achieve a better or enhanced critical switching current density, $J_c$, uniformity and less noise. Any one of or each of the spacer layers 456a, 456b, may be a non magnetic spacer layer, for example of a conductive and non-magnetic material (e.g. a conductor) such as a material including but not limited to tantalum (Ta), palladium (Pd), platinum (Pt), ruthenium (Ru), rhodium (Rh), hafnium (Hf), zirconium (Zr), iridium (Ir), osmium (Os), titanium (Ti), vanadium (V), chromium (Cr) or any combination thereof. In various embodiments, any one of or each of the spacer layers 456a, 456b, may include copper (Cu) which may have a spin diffusion length in the micrometer scale. In various embodiments, any one of or each of the spacer layers 456a, 456b may have a thickness of between about 1 nm and about 15 nm.

In various embodiments, the static field from the first offsetting magnetic layer structure 446a may offset the magnetization of the first free magnetic layer structure 444a, for example changing the axis of the non-transitory magnetization orientation of the first free magnetic layer structure 444a towards out of plane direction relative to the easy axis 401. In other words, the non-transitory magnetization orientation of the first free magnetic layer structure 444a may be offset from the initial axis or easy axis 401 to an offset axis 405a, which between the initial axis or easy axis 401 and the offset axis 405a, an angle (e.g. an acute angle) $\theta_a$ may be provided or defined.

In various embodiments, the static field from the first offsetting magnetic layer structure 446a on the first free magnetic layer structure 444a may be controlled or varied by tuning the materials of the first offsetting magnetic layer structure 446a and/or the distance (or spacing) between the first offsetting magnetic layer structure 446a and the first free magnetic layer structure 444a (for example varying the thickness of the spacer layer 456a) and/or the size of the magnetoresistive device 440.

As the fixed magnetic layer structure 442 is further away or distal from the first offsetting magnetic layer structure 446a, the corresponding magnetization or magnetization orientation may remain along the easy axis 401, or at least has an offset angle that may be different (e.g. smaller) as compared to the offset angle $\theta_a$ of that for the offset non-transitory magnetization orientation of the first free magnetic layer structure 444a. Therefore, the axis 405a of the offset non-transitory magnetization orientation of the first free magnetic layer structure 444a and axis 401 of the magnetization orientation of the fixed magnetic layer structure 442 may be off aligned relative to each other, for example by a non-zero angle (e.g. an acute angle) $\theta_a$.

In various embodiments, the static field from the second offsetting magnetic layer structure 446b may offset the magnetization of the second free magnetic layer structure 444b, for example changing the axis of the non-transitory magnetization orientation of the second free magnetic layer structure 444b, towards out of plane direction relative to the easy axis 401. In other words, the non-transitory magnetization orientation of the second free magnetic layer structure 444b may be offset from the initial axis or easy axis 401 to an offset axis 405b, which between the initial axis or easy axis 401 and the offset axis 405b, an angle (e.g. an acute angle) $\theta_b$ may be provided or defined.

In various embodiments, the static field from the second offsetting magnetic layer structure 446b on the second free magnetic layer structure 444b may be controlled or varied by tuning the materials of the second offsetting magnetic layer structure 446b and/or the distance (or spacing) between the second offsetting magnetic layer structure 446b and the second five magnetic layer structure 444b (for example varying the thickness of the spacer layer 456b) and/or the size of the magnetoresistive device 440.

As the fixed magnetic layer structure 442 is further away or distal from the second offsetting magnetic layer structure 446b, the corresponding magnetization or magnetization orientation may remain along the easy axis 401, or at least has an offset angle that may be different (e.g. smaller) as compared to the offset angle $\theta_b$ of that for the offset non-transitory magnetization orientation of the second free magnetic layer structure 444b. Therefore, the axis 405b of the offset non-transitory magnetization orientation of the second free magnetic layer structure 444b and the axis 401 of the magnetization orientation of the fixed magnetic layer structure 442 may be off aligned relative to each other, for example by a non-zero angle (e.g. an acute angle) $\theta_b$. In various embodiments, $\theta_a = \theta_b$.

As a result, the first free magnetic layer structure 444a and the second free magnetic layer structure 444b may have their respective non-transitory magnetization orientations offset from the easy axis 401. In other words, the respective offset non-transitory magnetization orientations of the first free magnetic layer structure 444a and the second free magnetic layer structure 444b may be along the respective axes 405a, 405b that are oriented at a non-zero angle (e.g. acute angle) relative to the easy axis 401, thereby providing an off aligned first free layer 444a and an off aligned second free layer 444b.

As shown in FIG. 4B, the arrows shown within the first free magnetic layer structure 444a and the second free magnetic layer structure 444b illustrate the directions of the respective offset non-transitory magnetization orientations of the first free magnetic layer structure 444a and the second free magnetic layer structure 444b, being substantially towards the upwardly left direction.

However, it should be appreciated that the magnetization orientation of the first offsetting magnetic layer structure 446a may point in the left direction, such that the offset non-transitory magnetization orientation of the first free magnetic layer structure 444a may be oriented towards the upwardly right direction, and/or the magnetization orientation of the second offsetting magnetic layer structure 446b may point in the left direction, such that the offset non-transitory magnetization orientation of the second free magnetic layer structure 444b may be oriented towards the upwardly right direction.

The illustration shown in FIG. 4B may for example be the initial state of the magnetoresistive device 440.

Accordingly, the magnetoresistive device 440 (e.g. a perpendicular STT-MRAM) may have a magnetic tunnel junction (MTJ) stack structure having off aligned/offset free layers (the first free magnetic layer structure 444a and the second free magnetic layer structure 444b) and additional magnetic layers (MLs), in the form of the first offsetting magnetic layer structure 446a and the second offsetting magnetic layer structure 446b. The first in-plane offsetting magnetic layer structure 446a may be arranged on top of or over the first free magnetic layer structure 444a to offset the magnetization of the first free magnetic layer structure 444a away from the perpendicular axis 401. The second in-plane offsetting magnetic layer structure 446b may be arranged below the second free magnetic layer structure 444b to offset the magnetization of the second free magnetic layer structure 444b away from the perpendicular axis 401.

With reference to FIG. 4C, the magnetoresistive device 480 may include a fixed magnetic layer structure 442, a first free magnetic layer structure 114a, a second free magnetic layer structure 444b, a first offsetting magnetic layer structure 446a and a second offsetting magnetic layer structure 446b, arranged one over the other, and spacer layers 454a, 454b, 456a, 456b, which may be as substantially described in the context of the embodiment of FIG. 4B.

The magnetoresistive device 480 further includes a first anti-ferromagnetic (AFM) layer 460a where the first in-plane offsetting magnetic layer structure 446a may be exchange biased by the first AFM layer 460a. The first AFM layer 460a may be arranged adjacent to the first offsetting magnetic layer structure 446a, for example in direct contact. The magnetoresistive device 480 further includes a second anti-ferromagnetic (AFM) layer 460b where the second in-plane offsetting magnetic layer structure 446b may be exchange biased by the second AFM layer 460b. The second AFM layer 460b may be arranged adjacent to the second offsetting magnetic layer structure 446b, for example in direct contact. Any one of or each of the first offsetting magnetic layer structure 446a or the second offsetting magnetic layer structure 446b may be a single magnetic layer or an un-balanced SAF structure in order to achieve higher stability and fine tune the stray field on the fixed magnetic layer structure 442.

Figure 5A:
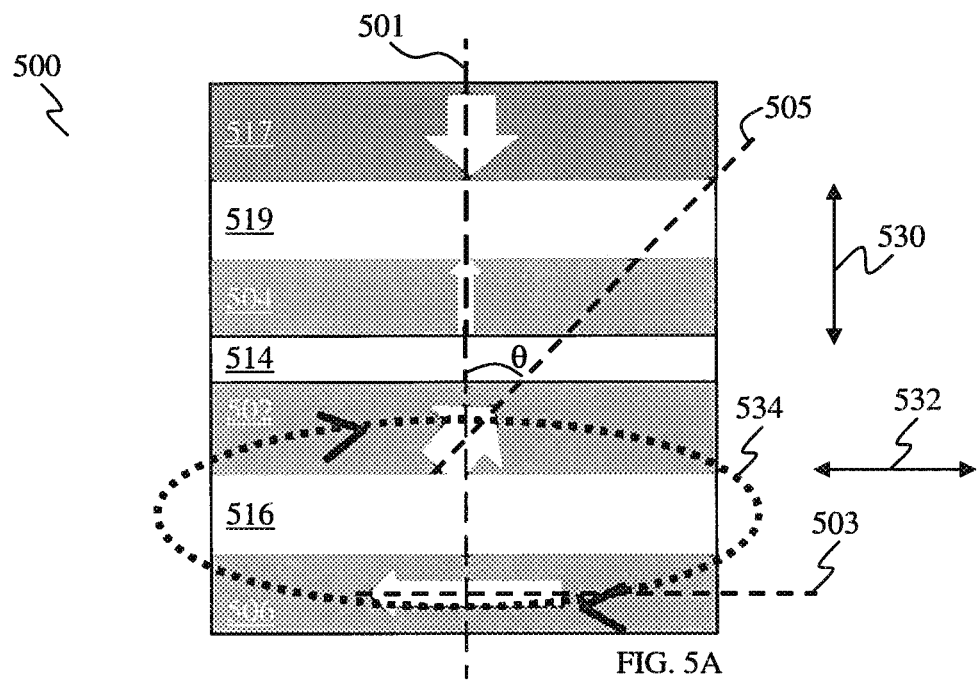
FIGS. 5A to 5C show schematic cross-sectional views of respective magnetoresistive devices with perpendicular anisotropy, according to various embodiments.
Figure 5B:
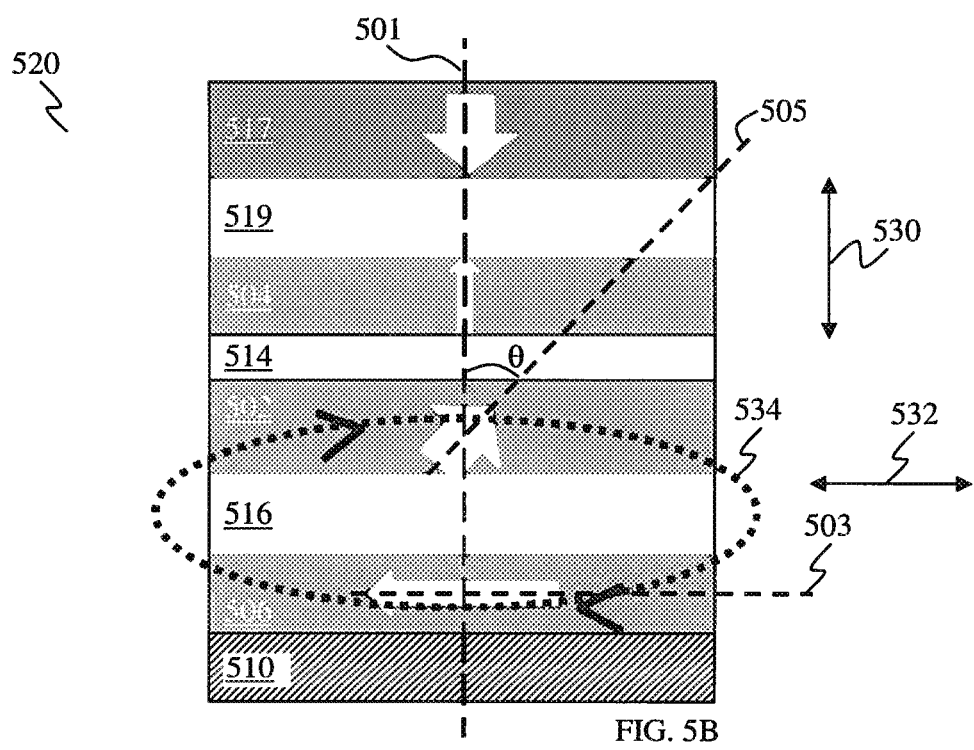
Figure 5C:
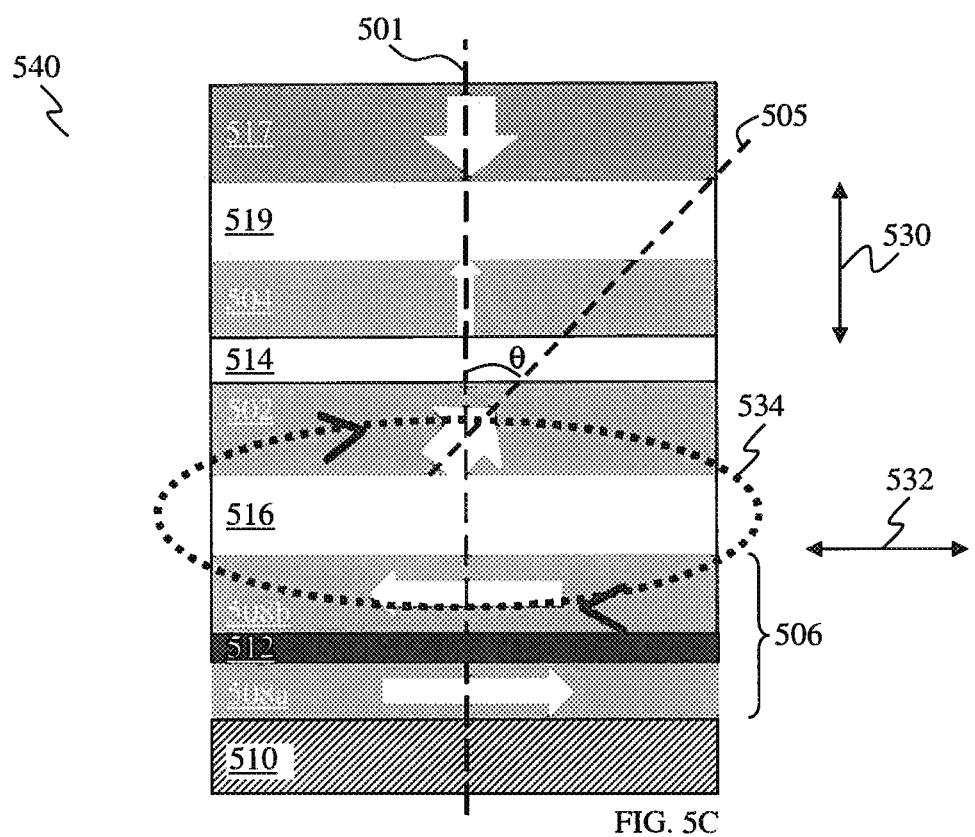

FIGS. 5A to 5C show schematic cross-sectional views of respective magnetoresistive devices 500, 520, 540, with perpendicular anisotropy, according to various embodiments. The magnetoresistive devices 500, 520, 540, may respectively be a 1-bit per cell magnetic random access memory (MRAM). The magnetoresistive devices 500, 520, 540, may respectively be a tunneling magnetoresistive (TIM) device, e.g. a spin transfer torque magnetic random access memory (STT-MRAM) with perpendicular anisotropy. The magnetoresistive devices 500, 520, 540, may respectively have a stack arrangement, having for example a plurality of ferromagnetic layers.

The magnetoresistive device 500 includes a fixed magnetic layer structure (reference layer; RL) 502, a free magnetic layer structure (free layer; FL) 504, and an offsetting magnetic layer structure (magnetic layer; ML) 506, arranged one over the other. The fixed magnetic layer structure 502, the free magnetic layer structure 504 and the offsetting magnetic layer structure 506 may form part of a magnetic junction of the magnetoresistive device 500.

The fixed magnetic layer structure 502 may be arranged or sandwiched in between the free magnetic layer structure 504 and the offsetting magnetic layer structure 506. As shown in FIG. 5A, the offsetting magnetic layer structure 506 with in-plane anisotropy may be applied or arranged below the fixed magnetic layer structure 502 for the magnetoresistive device (e.g. perpendicular STT-MRAM 500, to tilt or offset the magnetization orientation of the fixed magnetic layer structure 502.

The fixed magnetic layer structure 502 may have a fixed magnetization orientation and the free magnetic layer structure 504 may have a variable or free magnetization orientation.

The free magnetic layer structure 504 may have a magnetization orientation with a perpendicular axis (e.g. easy axis) 501, along the direction as represented by the arrow 530, being parallel to the thickness direction. As shown in FIG. 5A, the arrow shown within the free magnetic layer structure 504 illustrates the magnetization orientation of the free magnetic layer structure 504. While the arrow is shown pointing in an upward direction to represent the magnetization orientation of the free magnetic layer structure 504 being oriented in an upwardly direction, it should be appreciated that the arrow may be illustrated as pointing in a downward direction, such that a magnetization orientation in the opposite direction to that of the embodiment of FIG. 5A may be provided for the free magnetic layer structure 504.

The offsetting, magnetic layer structure 506 may be configured such that its axis (e.g. easy axis) 503 or magnetization orientation is oriented in a direction substantially perpendicular or orthogonal to the magnetic anisotropy of the free magnetic layer structure 504 and the thickness direction 530, or substantially parallel to the direction 532, thereby having in-plane anisotropy. The arrow shown within the offsetting magnetic layer structure 506 illustrates the direction of the magnetization orientation of the offsetting magnetic layer structure 506, which is towards the left direction.

The fixed magnetic layer structure 502 may have a magnetization orientation with a perpendicular axis (e.g. easy axis) 501 along the direction 530, along the thickness direction. Therefore, the axis 503 of the magnetization orientation of the offsetting magnetic layer structure 506 may be at least substantially non-parallel (e.g. being orthogonal) to the axis 501.

The magnetoresistive device 500 includes a spacer layer 514 arranged in between the fixed magnetic layer structure 502 and the free magnetic layer structure 504. The spacer layer 514 may be of a non-conductive and non-magnetic material (e.g. an insulator), for example magnesium oxide (MgO). However, it should be appreciated that other materials such as aluminum oxide ($AlO_x$), or titanium oxide ($TiO_x$) may also be used. The magnetoresistive device 500 may therefore be configured as a tunneling magnetoresistive (TMR) device.

However, it should be appreciated that the magnetoresistive device 500 may be configured as a giant magnetoresistive (GMR) device, with the spacer layer 514 having a conductive and non-magnetic material (e.g. a conductor), e.g. one or more of Cu, Ag, Au, Ta, Cr, Pd, Pt, Ir, Rh or Ru.

The magnetoresistive device 500 includes a spacer layer 516 arranged in between to the fixed magnetic layer structure 502 and the offsetting magnetic layer structure 506. The spacer layer 516 may be of a material with a short spin diffusion length so as to eliminate or at least minimise the spin current from the offsetting magnetic layer structure 506 and minimize the side STT effect from the offsetting magnetic layer structure 506 in order to achieve a better or enhanced critical switching current density, $J_c$, uniformity and less noise.

The spacer layer 516 may be a non magnetic spacer layer, for example of a conductive and non-magnetic material (e.g. a conductor). The spacer layer 516 may include a material including but not limited to tantalum (Ta), palladium (Pd), platinum (Pt), ruthenium (Ru), rhodium (Rh), hafnium (Hf), zirconium (Zr), iridium (Ti), osmium (Os), titanium (Ti), vanadium (V), chromium (Cr) or any combination thereof. In various embodiments, the spacer layer 516 may include copper (Cu) which may have a spin diffusion length in the micrometer scale. In various embodiments, the spacer layer 516 may have a thickness of between about 1 nm and about 15 nm.

The magnetoresistive device 500 further includes a biasing magnetic layer 517 arranged over or on top of the free magnetic layer structure 504. The biasing magnetic layer 517 may have perpendicular anisotropy, having a magnetization orientation that is at least substantially opposite to the magnetization orientation of the fixed magnetic layer structure 502. With such an arrangement, the bias field or static field from the biasing magnetic layer 517 may compensate for or cancel the bias field from the fixed magnetic layer structure 502 on the free magnetic layer structure 504. This may result in symmetrical writing current for writing a '0' and a '1'.

In other words, a biasing magnetic layer 517 may be integrated, whose magnetization is substantially anti-parallel with that of the fixed magnetic layer structure 502 so that the bias field from the fixed magnetic layer structure 502 on the free magnetic layer structure 504 may be cancelled to achieve symmetrical current induced magnetization switching.

The biasing magnetic layer 517 may include a material including but not limited to cobalt-iron (CoFe) or cobalt-iron-boron (CoFeB). The biasing magnetic layer 517 may have a thickness of between about 2 nm and about 15 nm.

The magnetoresistive device 500 further includes a non-magnetic spacer layer 519 in between the biasing magnetic layer 517 and the free magnetic layer structure 504. The spacer layer 519 may be of a material with a short spin diffusion length, for example so as to eliminate or at least minimise the spin current from the biasing magnetic layer 517. The spacer layer 519 may be a non magnetic spacer layer, for example of a conductive and non-magnetic material (e.g. a conductor). The spacer layer 519 may include a material including but not limited to tantalum (Ta), palladium (Pd), platinum (Pt), ruthenium (Ru), rhodium (Rh), hafnium (HO, zirconium (Zr), iridium (Ir), osmium (Os), titanium (Ti), vanadium (V), chromium (Cr) or any combination thereof.

In various embodiments, the static field from the offsetting magnetic layer structure 506 may offset the magnetization of the fixed magnetic layer structure 502, for example changing the axis of the magnetization orientation of the fixed magnetic layer structure 502, towards out of plane direction relative to the axis 501. In other words, the magnetization orientation of the fixed magnetic layer structure 502 may be offset from the initial axis or easy axis 501 to an offset axis 505, which between the initial axis or easy axis 501 and the offset axis 505, an angle (e.g. an acute angle) θ may be provided or defined. The dotted arrow as represented by 534 illustrates the effect of the static field from the offsetting magnetic layer structure 506 in offsetting the magnetization orientation of the fixed magnetic layer structure 502.

As a result, the fixed magnetic layer structure 502 may have its magnetization orientation offset from the easy axis 501. In other words, the offset magnetization orientation of the fixed magnetic layer structure 502 may be along an axis 505 that is oriented at a non-zero angle (e.g. acute angle) relative to the easy axis 501, thereby providing an off aligned reference layer 502.

In various embodiments, the static field from the offsetting magnetic layer structure 506 on the fixed magnetic layer structure 502 may be controlled or varied by tuning the materials of the offsetting magnetic layer structure 506 and/or the distance (or spacing) between the offsetting magnetic layer structure 506 and the fixed magnetic layer structure 502 (for example varying the thickness of the spacer layer 516) and/or the size of the magnetoresistive device 500.

As the free magnetic layer structure 504 is further away or distal from the offsetting magnetic layer structure 506, the corresponding magnetization or magnetization orientation may remain along the axis 501, or at least has an offset angle that may be different (e.g. smaller) as compared to the offset angle θ of that for the offset magnetization orientation of the fixed magnetic layer structure 502. Therefore, the axis 501 of the magnetization orientation of the free magnetic layer structure 504 and the axis 505 of the offset magnetization orientation of the fixed magnetic layer structure 502 may be off aligned relative to each other, for example by a non-zero angle (e.g. an acute angle).

As shown in FIG. 5A, the arrow shown within the fixed magnetic layer structure 502 illustrates the direction of the offset magnetization orientation of the fixed magnetic layer structure 502, being substantially towards the upwardly right direction.

However, it should be appreciated that the magnetization orientation of the offsetting magnetic layer structure 506 may point in the right direction, such that the offset magnetization orientation of the fixed magnetic layer structure 502 may be oriented towards the upwardly left direction.

The illustration shown in FIG. 5A may for example be the initial state of the magnetoresistive device 500.

Accordingly, the magnetoresistive device 500 (e.g. a perpendicular STT-MRAM) may have a magnetic tunnel junction (MTJ) stack structure having an off aligned/offset reference layer (the fixed magnetic layer structure 502) and an additional magnetic layer (ML), in the form of the offsetting magnetic layer structure 506. The in-plane offsetting magnetic layer structure 506 may be arranged below the fixed magnetic layer structure 502 to offset the magnetization of the fixed magnetic layer structure 502 away from the perpendicular axis 501. The biasing magnetic layer 517 may be arranged on top or over the free magnetic layer structure 504.

With reference to FIG. 5B, the magnetoresistive device 520 may include a fixed magnetic layer structure 502, a free magnetic layer structure 504, an offsetting magnetic layer structure 506, and a biasing magnetic layer 517, arranged one over the other, and spacer layers 514, 516, 519, which may be as substantially described in the context of the embodiment of FIG. 5A. The magnetoresistive device 520 further includes an anti-ferromagnetic (AFM) layer 510 positioned below the offsetting magnetic layer structure 506, where the in-plane offsetting magnetic layer structure 506 may be exchange biased by the AFM layer 510 in order to achieve higher stability. The AFM layer 510 may be arranged adjacent to the offsetting magnetic layer structure 506, for example in direct contact.

With reference to FIG. 5C, the magnetoresistive device 540 may include a fixed magnetic layer structure 502, a free magnetic layer structure 504 and a biasing magnetic layer 517, arranged one over the other, and spacer layers 514, 516, 519, which may be as substantially described in the context of the embodiments of FIGS. 5A and 5B. The magnetoresistive device 540 further includes an anti-ferromagnetic (AFM) layer 510, which may be as substantially described in the context of the embodiment of FIG. 5B.

The magnetoresistive device 540 further includes an offsetting magnetic layer structure 506, in the form of an unbalanced synthetic anti-ferromagnetic (SAF) structure, so as to achieve higher stability and fine tune the stray field on the fixed magnetic layer structure 502. The SAF structure 506, for example in terms of the materials and/or arrangement, may be as substantially described in the context of the SAF structure 202 of the embodiment of FIG. 2.

The SAF structure 506 may be an in-plane SAF, and includes two antiferromagnetically coupled ferromagnetic layers with in-plane anisotropy (along a direction as represented by the arrow 532), in the form of a first ferromagnetic layer 508a, which may be as substantially described in the context of the first ferromagnetic layer 208a (FIG. 2), and a second ferromagnetic layer 208b, which may be as substantially described in the context of the second ferromagnetic layer 208b (FIG. 2), with oppositely oriented magnetization directions or orientations, pinned by the anti-ferromagnetic (AFM) layer 510. A spacer layer 512 may be sandwiched in between the first ferromagnetic layer 508a and the second ferromagnetic layer 508b. The spacer layer 512 may be as substantially described in the context of the spacer layer 212 (FIG. 2).

In various embodiments, the SAF structure 506 may have a net magnetization orientation pointing in the direction towards the right. Therefore, the SAF structure 202 may have a net magnetization orientation with an in-plane axis (e.g. easy axis) along the direction 532.

Accordingly, each of the magnetoresistive devices 500, 520, 540, may have a stack structure design, for example a MD structure, for a perpendicular STT-MRAM with an off aligned/offset reference layer and symmetrical writing current.

In the context of various embodiments, a free layer may be deposited or arranged after (e.g. over) a reference layer, where both layers may be separated by a non-magnetic tunnel barrier therebetween. In the context of various embodiments, it is also possible to have a free layer deposited or arranged before (e.g. below) a reference layer and the structure is reversed as compared to the above mentioned arrangement. Accordingly, in various embodiments, a free layer and a reference layer may be arranged one over the other. The free layer and the reference layer may be spaced apart by a non-conductive and non-magnetic spacer layer or an insulator spacer layer.

In the context of various embodiments, any one of or each of the free layer (FL) (e.g. the free magnetic layer structure and/or the second free magnetic layer structure) and/or the reference layer (RL) (e.g. the fixed magnetic layer structure and/or the second fixed magnetic layer structure) may be a single layer or a composite structure made of more than one ferromagnetic layer, e.g. a bilayer structure or a multilayer structure.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A magnetoresistive device comprising:
   a fixed magnetic layer structure having a fixed magnetization orientation along a first easy axis;
   a free magnetic layer structure having a variable magnetization orientation along a second easy axis; and
   an offsetting magnetic layer structure having a magnetization orientation along an axis at least substantially non-parallel to at least one of the first easy axis or the second easy axis,
   wherein the fixed magnetic layer structure, the free magnetic layer structure and the offsetting magnetic layer structure are arranged one over the other.

2. The magnetoresistive device as claimed in claim 1, wherein the axis of the magnetization orientation of the offsetting magnetic layer structure is at least substantially orthogonal to at least one of the first easy axis or the second easy axis.

3. The magnetoresistive device as claimed in claim 1, wherein a static field of the offsetting magnetic layer structure offsets the magnetization orientation of the fixed magnetic layer structure such that between the first easy axis and an axis of the offset magnetization orientation of the fixed magnetic layer structure, an acute angle is provided.

4. The magnetoresistive device as claimed in claim 1, wherein for a non-transitory state of the magnetization orientation of the free magnetic layer structure, a static field of the offsetting magnetic layer structure offsets the non-transitory magnetization orientation of the free magnetic layer structure such that between the second easy axis and an axis of the offset non-transitory magnetization orientation of the free magnetic layer structure, an acute angle is provided.

5. The magnetoresistive device as claimed in claim 1, wherein at least one of the first easy axis is at least substantially parallel to a thickness direction of the fixed magnetic layer structure or the second easy axis is at least substantially parallel to a thickness direction of the free magnetic layer structure.

6. The magnetoresistive device as claimed in claim 1, wherein at least one of the first easy axis is at least substantially perpendicular to a thickness direction of the fixed magnetic layer structure or the second easy axis is at least substantially perpendicular to a thickness direction of the free magnetic layer structure.

7. The magnetoresistive device as claimed in claim 1, further comprising a spacer layer between the offsetting magnetic layer structure and at least one of the fixed magnetic layer structure or the free magnetic layer structure, the spacer layer having a spin diffusion length configured to reduce interaction of a spin current from the offsetting magnetic layer structure on at least one of the fixed magnetic layer structure or the free magnetic layer structure.

8. The magnetoresistive device as claimed in claim 7, wherein the spacer layer has a thickness between about 1 nm and about 15 nm.

9. The magnetoresistive device as claimed in claim 1, further comprising an anti-ferromagnetic layer configured for exchange biasing with the offsetting magnetic layer structure.

10. The magnetoresistive device as claimed in claim 1, further comprising a biasing magnetic layer configured to provide a bias field on the free magnetic layer structure for compensating a bias field generated by the fixed magnetic layer structure on the free magnetic layer structure.

11. The magnetoresistive device as claimed in claim 10, wherein the biasing magnetic layer has a magnetization orientation at least substantially opposite to the magnetization orientation of the fixed magnetic layer structure.

12. The magnetoresistive device as claimed in claim 10, further comprising a second spacer layer between the biasing magnetic layer and at least one of the fixed magnetic layer structure or the free magnetic layer structure, the second spacer layer having a spin diffusion length configured to reduce interaction of a spin current from the biasing magnetic layer on at least one of the fixed magnetic layer structure or the free magnetic layer structure.

13. The magnetoresistive device as claimed in claim 1, further comprising a second free magnetic layer structure having a variable magnetization orientation along a third easy axis, wherein the axis of the magnetization orientation of the offsetting magnetic layer structure is at least substantially non-parallel to the third easy axis.

14. The magnetoresistive device as claimed in claim 13, further comprising a second offsetting magnetic layer structure having a magnetization orientation along an axis at least substantially non-parallel to the third easy axis.

15. The magnetoresistive device as claimed in claim 14, wherein the axis of the magnetization orientation of the second offsetting magnetic layer structure is at least substantially orthogonal to the third easy axis.

16. The magnetoresistive device as claimed in claim 14, wherein for a non-transitory state of the magnetization orientation of the second free magnetic layer structure, a static field of the second offsetting magnetic layer structure offsets the non-transitory magnetization orientation of the second free magnetic layer structure such that between the third easy axis and an axis of the offset non-transitory magnetization orientation of the second free magnetic layer structure, an acute angle is provided.

17. The magnetoresistive device as claimed in claim 14, further comprising a second fixed magnetic layer structure having a fixed magnetization orientation along a fourth easy axis, wherein the axis of the magnetization orientation of the second offsetting magnetic layer structure is at least substantially non-parallel to the fourth easy axis.

18. The magnetoresistive device as claimed in claim 1, wherein the offsetting magnetic layer structure comprises a single magnetic layer, a bilayer structure or a synthetic anti-ferromagnetic structure.

19. The magnetoresistive device as claimed in claim 18, wherein the single magnetic layer comprises cobalt-iron or cobalt-iron-boron, or wherein the bilayer structure comprises a first layer of material selected from the group consisting of cobalt and cobalt-iron, and a second layer of material selected from the group consisting of palladium, platinum and nickel.

20. A method of forming a magnetoresistive device, the method comprising:
- forming a fixed magnetic layer structure having a fixed magnetization orientation along a first easy axis;
- forming a free magnetic layer structure having a variable magnetization orientation along a second easy axis; and
- forming an offsetting magnetic layer structure having a magnetization orientation along an axis at least substantially non-parallel to at least one of the first easy axis or the second easy axis,
- wherein the fixed magnetic layer structure, the free magnetic layer structure and the offsetting magnetic layer structure are arranged one over the other.

* * * * *